(12) United States Patent
Chong et al.

(10) Patent No.: US 12,547,083 B2
(45) Date of Patent: Feb. 10, 2026

(54) USE OF ALTERNATING LAYER PATTERNS APPROACH FOR EFFECTIVE OVERLAY METROLOGY IN MULTI-STACK DIE APPLICATIONS

(71) Applicant: Applied Materials, Inc., Santa Clara, CA (US)

(72) Inventors: Yau Loong Chong, Singapore (SG); Venkatakaushik Voleti, San Jose, CA (US); Ruiping Wang, San Jose, CA (US); Mehdi Vaez-Iravani, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 184 days.

(21) Appl. No.: 18/485,147

(22) Filed: Oct. 11, 2023

(65) Prior Publication Data
US 2025/0123569 A1   Apr. 17, 2025

(51) Int. Cl.
G03F 7/00       (2006.01)
G01N 21/95      (2006.01)
G06T 7/00       (2017.01)

(52) U.S. Cl.
CPC ......... *G03F 7/70633* (2013.01); *G03F 7/705* (2013.01); *G03F 7/70625* (2013.01); *G06T 7/0004* (2013.01); *G06T 2207/30148* (2013.01)

(58) Field of Classification Search
CPC .. G03F 7/70633; G03F 7/705; G03F 7/70625; G06T 7/0004; G06T 2207/30148
See application file for complete search history.

(56) References Cited

U.S. PATENT DOCUMENTS

| | | |
|---|---|---|
| 2009/0072414 A1 | 3/2009 | Tenmei et al. |
| 2011/0291246 A1 | 12/2011 | Jo et al. |
| 2019/0304852 A1 | 10/2019 | Seyama |
| 2023/0307412 A1 | 9/2023 | Chang |

FOREIGN PATENT DOCUMENTS

KR          101332858 B1     11/2013

OTHER PUBLICATIONS

International Search Report/ Written Opinion issued to patent application No. PCT/US2024/050553 on Jan. 17, 2025.

*Primary Examiner* — Mesfin T Asfaw
(74) *Attorney, Agent, or Firm* — Patterson + Sheridan, LLP

(57) ABSTRACT

Embodiments of the disclosure include a method for forming a device comprising generating an image of a second die that is bonded on a first die that is bonded on a base substrate, the first die having a first feature formed on a first surface of the first die and the second die having a second feature formed on a second surface of the second die, determining a relative displacement between portions of the first feature and the second feature based on the generated image, and determining updated alignment instructions based on the determined relative displacement.

13 Claims, 16 Drawing Sheets

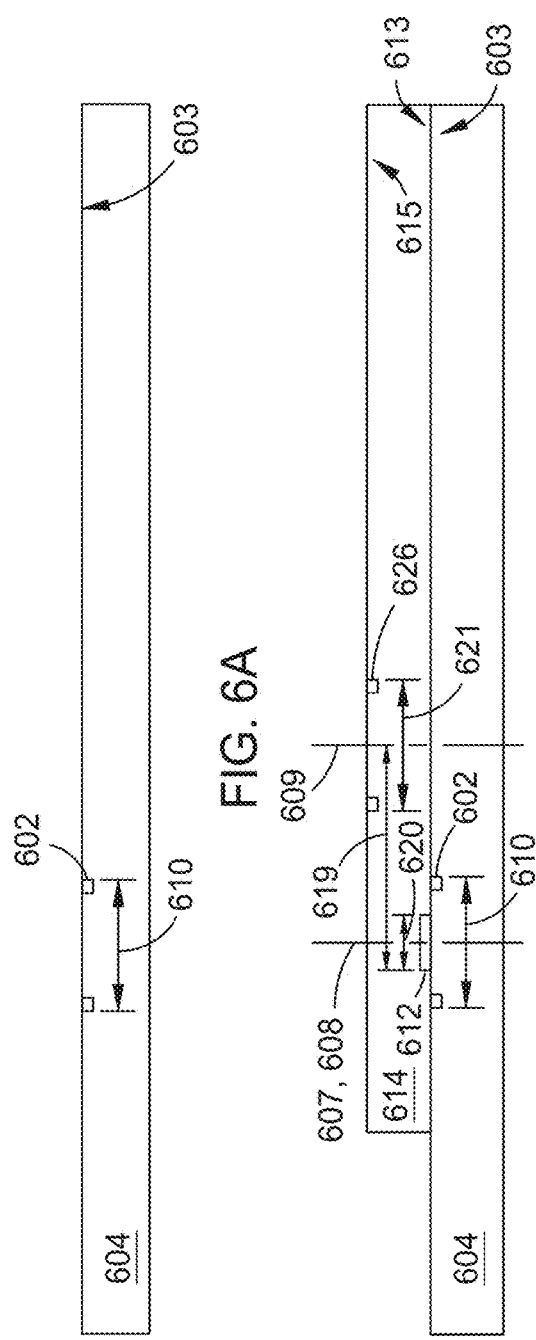
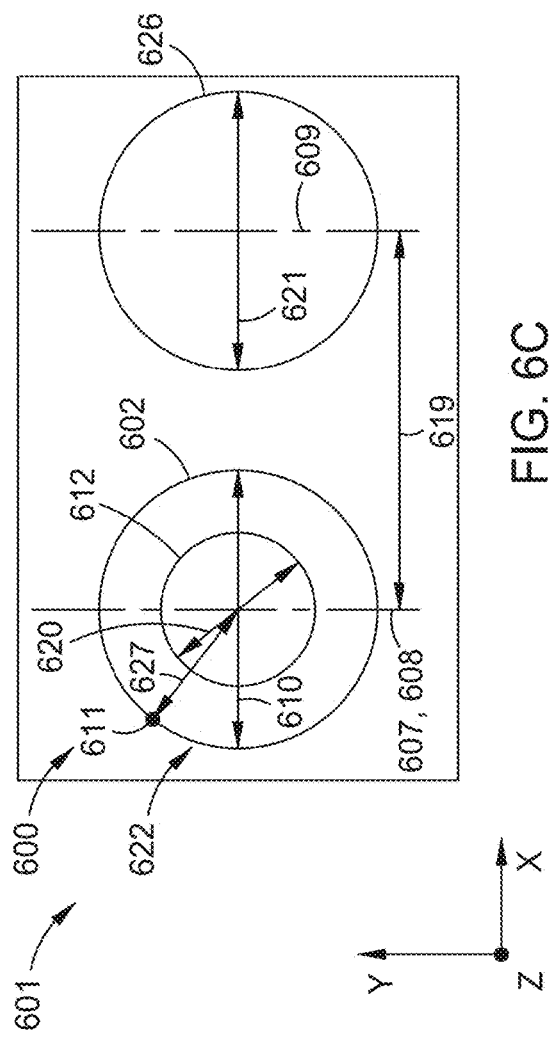
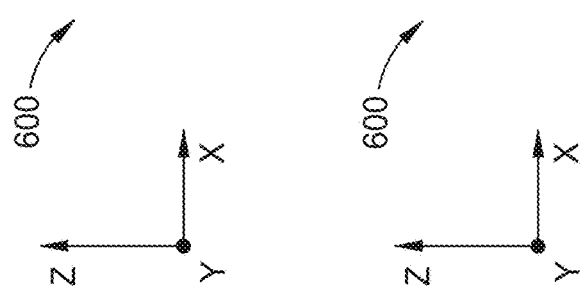

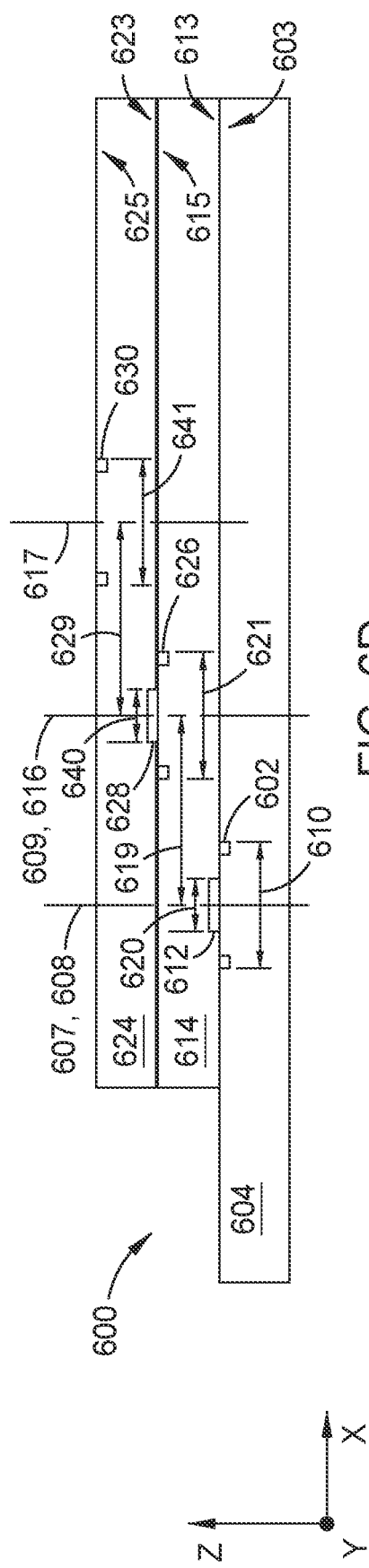
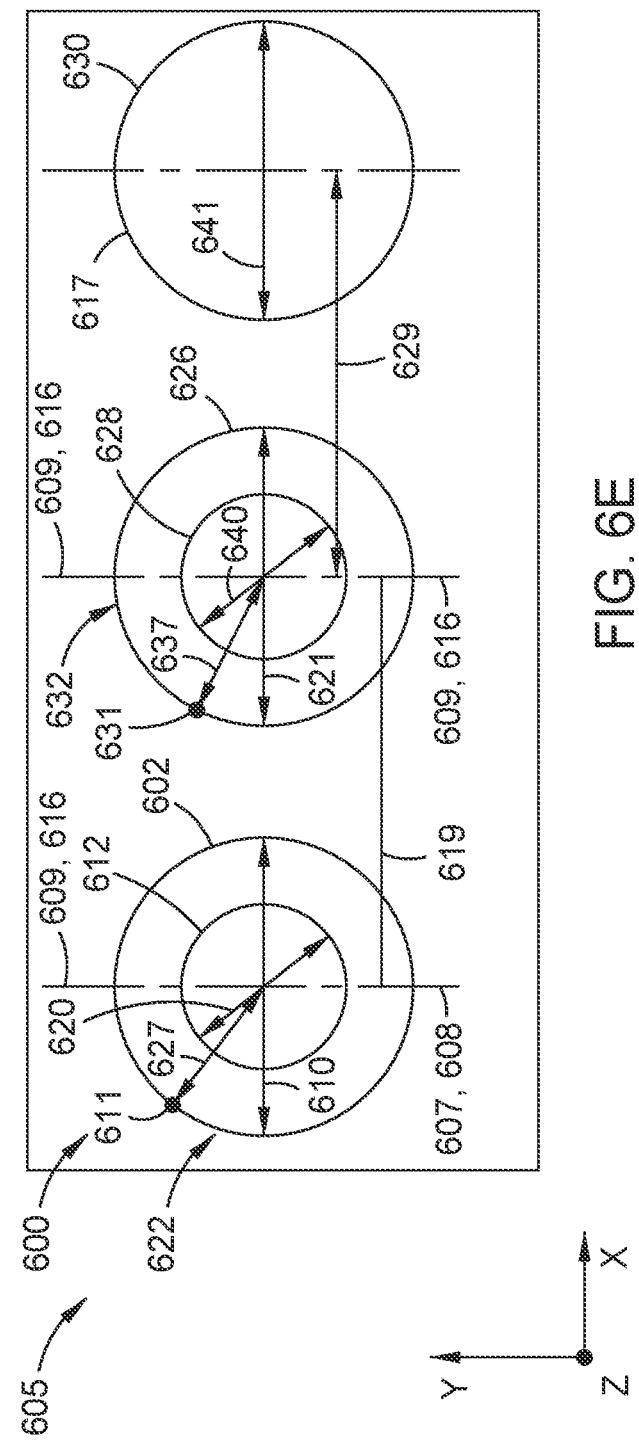
FIG. 6D
FIG. 6E

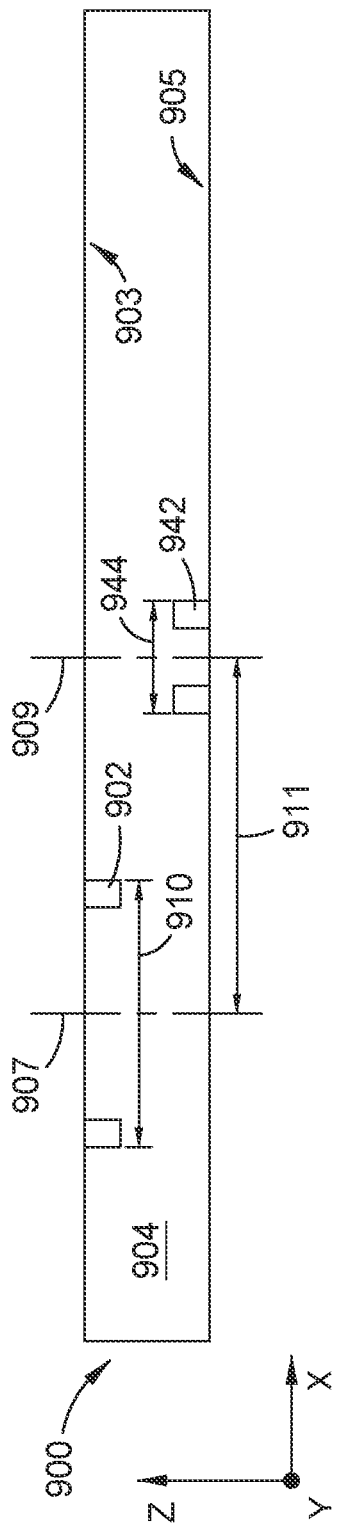
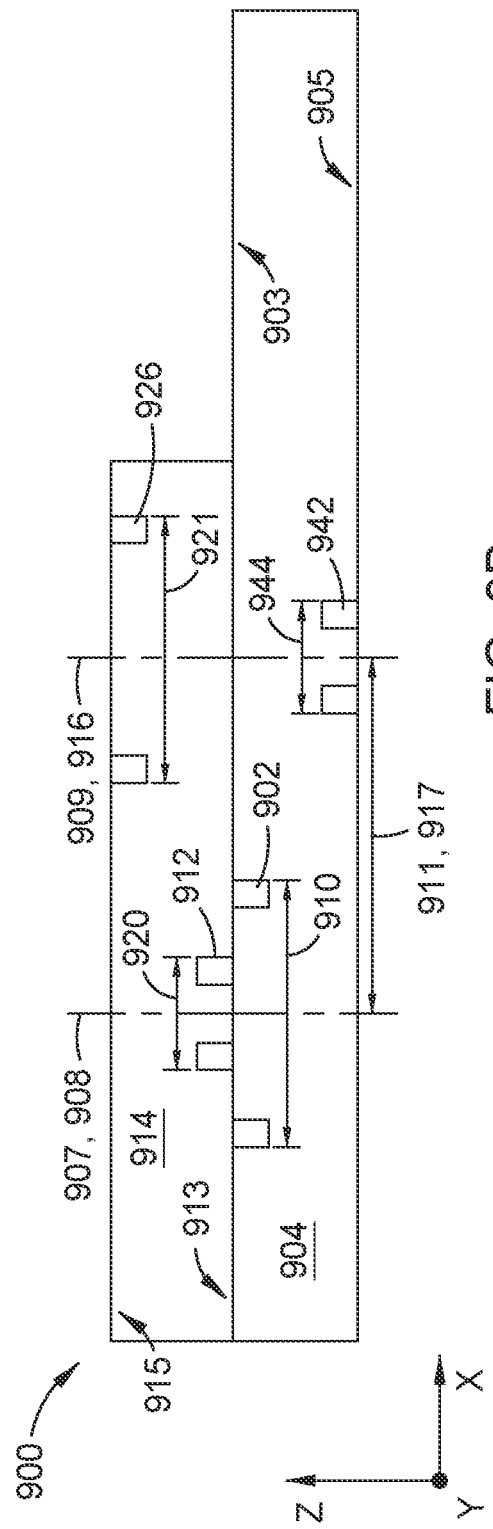

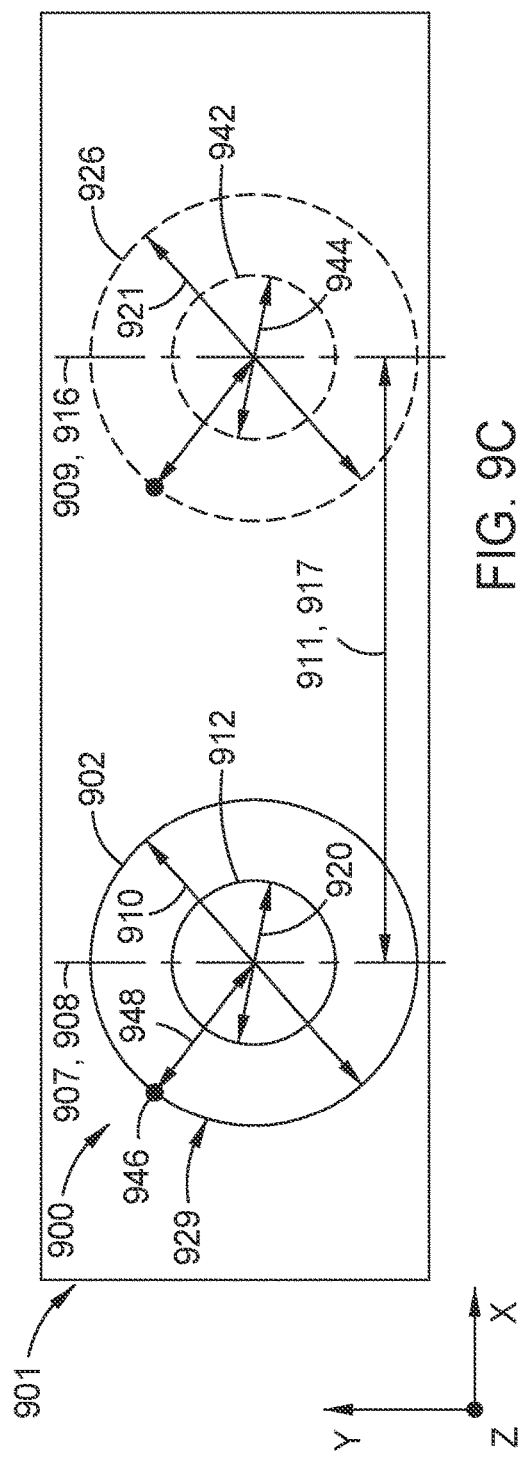
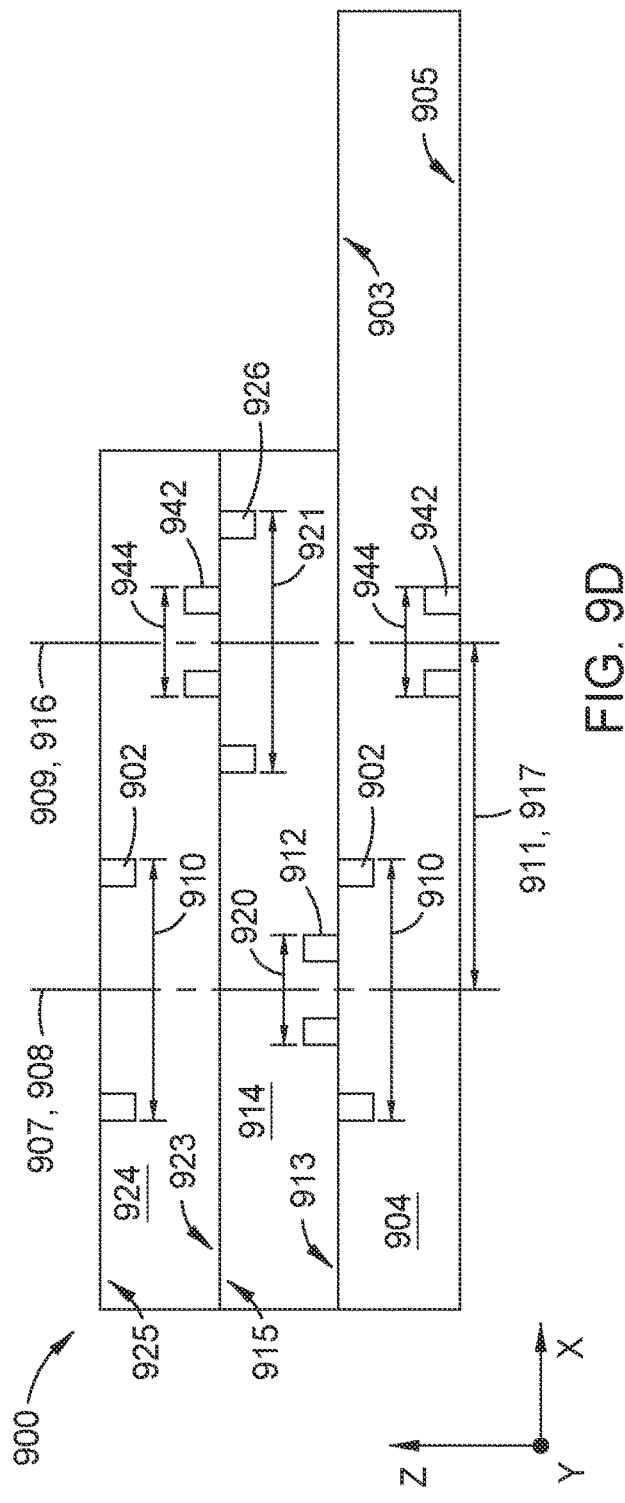
FIG. 9C
FIG. 9D

USE OF ALTERNATING LAYER PATTERNS APPROACH FOR EFFECTIVE OVERLAY METROLOGY IN MULTI-STACK DIE APPLICATIONS

BACKGROUND

Field

Embodiments of the present disclosure generally relate to a method and apparatus for forming an aligned 3D integrated circuit (3D IC).

Description of the Related Art

Electronic devices, such as are included in tablets, computers, copiers, digital cameras, smart phones, control systems, and automated teller machines, among others, often include integrated circuit die(s) for some desired functionality. A three-dimensional (3D) device package is a type of microelectronics device packaging structure that integrates multiple fabricated dies into a single stacked compact package. This approach allows designers to create more complex and powerful systems by integrating different components that have an improved power consumption levels and performance.

A 3D device package can include a three-dimensional integrated circuit (3D IC), which is an integrated circuit fabricated by stacking at least two or more 2D ICs (e.g., die) vertically using, for example, through silicon vias (TSVs), or copper-copper (Cu—Cu) connections. Stated differently multiple dies may be stacked vertically on one another so that they behave as a single device to achieve device performance improvements at a reduced power and footprint (size).

In order for the 3D IC in a 3D device package to operate correctly the patterned layers of the at least two or more ICs (or die) must be aligned so that the stacked ICs can be desirably interconnected. Misalignment between the 2D ICs may cause short circuits, connection failures, or the like. As the 2D ICs increase in complexity while decreasing in size, alignment becomes more important and much more complex.

Therefore, there is a need for an apparatus and method of reliably stacking two or more ICs or die that solves the problems described above.

SUMMARY

In an embodiment a method for forming a device includes generating an image of a second die that is bonded on a first die that is bonded on a base substrate, the first die having a first feature formed on a first surface of the first die and the second die having a second feature formed on a second surface of the second die, determining a relative displacement between portions of the first feature and the second feature based on the generated image, and determining updated alignment instructions based on the determined relative displacement.

In another embodiment a method for forming a device includes generating a first image of a second die that is bonded on a first die that is bonded onto a base substrate, the second die having a first feature disposed on a first surface of the second die, the base substrate having a base feature formed on a base surface of the base substrate, and the first image is parallel to a first plane that is parallel to the base surface of the base substrate and includes at least a portion of the first feature of the second die and at least a portion of the base feature of the base substrate, determining a first distance in a first direction between the portions of the first feature and the base feature, the first direction being a direction parallel to the first plane, and determining updated alignment instructions based on the first distance between the first feature and the base feature.

In another embodiment an optical inspection system includes a controller, a memory for storing a program to be executed in the controller, the program comprising instructions when executed cause the controller to: generate an image of a second die that is bonded on a first die that is bonded on a base substrate, the first die having a first feature formed on a first surface of the first die and the second die having a second feature formed on a second surface of the second die, determine a relative displacement between portions of the first feature and the second feature based on the generated image, and determine updated alignment instructions based on the determined relative displacement.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 6A-6E are schematic, cross-sectional views of a portion of a stacked semiconductor assembly during a method of forming a stacked semiconductor assembly, according to one or more embodiments.

FIGS. 9A-9G are schematic, cross-sectional views of a portion of stacked semiconductor assembly during a method of forming the stacked semiconductor assembly, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A three-dimensional integrated circuit (3D IC) is an integrated circuit fabricated by vertically stacking at least two or more 2D ICs, which are also referred to herein as die. In order for the 3D IC to operate correctly the patterned layers of interconnecting circuit elements (e.g., conductive pads, traces, or other similar current carrying elements) within the at least two or more ICs must be aligned prior to being bonded together. Misalignment between the 2D ICs may cause short circuits, connection failures, or the like. Two-dimensional (2D) ICs are each formed as separate die (i.e., portions of a larger wafer) that are stacked vertically. In various embodiments, each of the dies include features formed on non-functional portions of each die. The non-functional portions of the die can include non-electrical circuit containing regions of the die, such as regions disposed within one or more device fabrication layers or base substrate positioned at the peripheral edges (e.g., portions of the remaining scribe lines) or open regions formed between circuits formed within the die. Features on different dies may have the same or different cross-sectional shapes and/or critical dimensions. The 2D ICs may be stacked and aligned based on overlay (OVL) distance measurements between the different features formed on the different dies determined using an optical inspection system, and/or the critical dimensions of each features.

Example Optical Inspection System

Figure 1A:
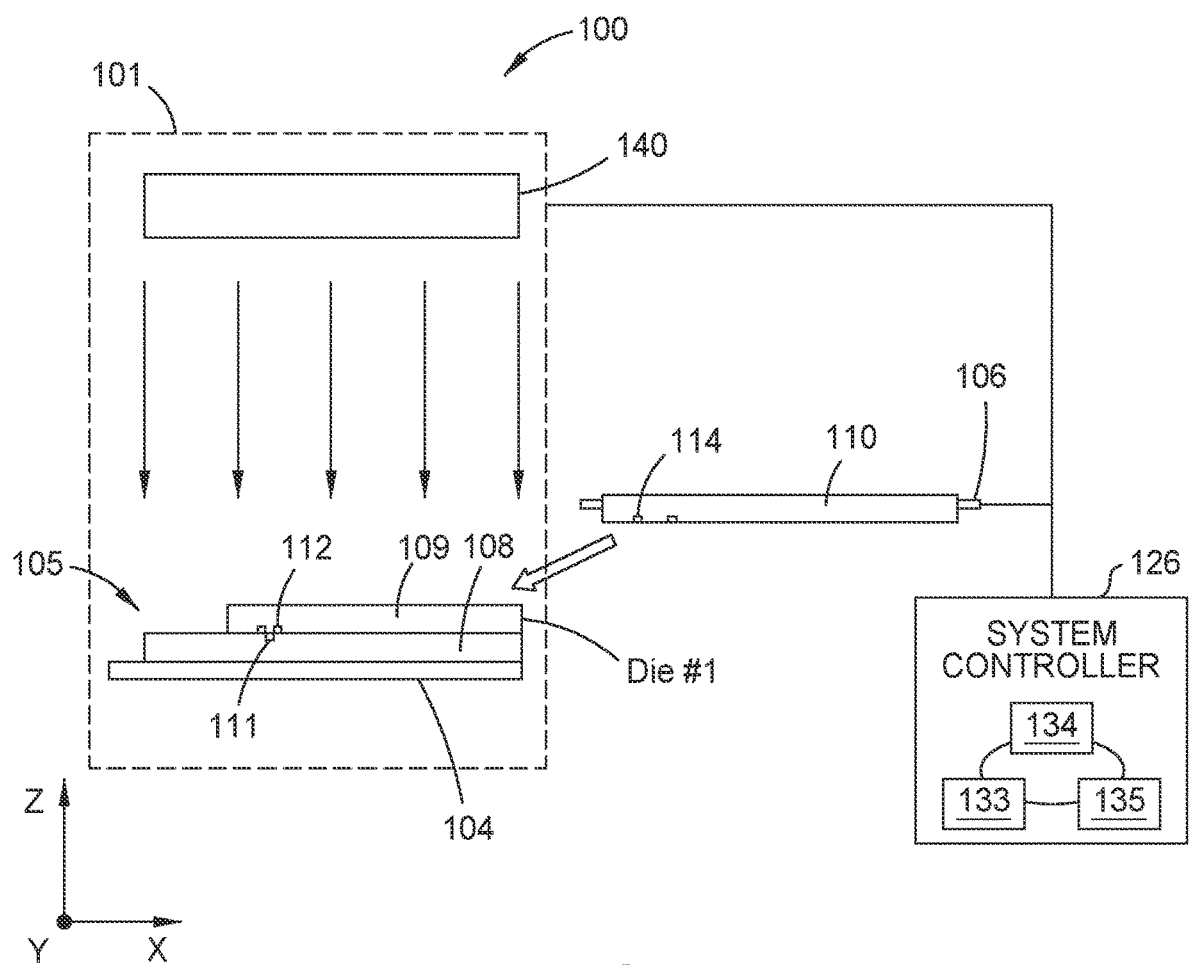
FIG. 1A is a schematic cross-sectional view of an optical inspection system, according to one or more embodiments.

FIG. 1A is a simplified cross-sectional view of an optical inspection system 100, according to one or more examples. In various embodiments, the optical inspection system 100 may include an imaging device 101, a robot end effector system 106, and a controller 126. The imaging device 101 may include, and is not limited to, a stage 104, at least one lens (not shown), and an imaging sensor 140, and a light source (not shown). The controller 126 may be communicatively coupled to the imaging device 101 and the robot end effector system 106. The optical inspection system 100 is used to detect the location of features formed in the components within a stacked semiconductor assembly 105 and align the components of the stacked semiconductor assembly 105 (i.e., a 3D IC) based on the location of the features. The components within the stacked semiconductor assembly 105 can include a base substrate and at least one or more die, which are also referred to herein as 2D ICs.

In one example, each component (e.g., base substrate or die) of the stacked semiconductor assembly 105 includes at least one feature that that is configured to have a negligible effect on the operation of the stacked semiconductor assembly 105. Each of the feature(s) may be utilized by the optical inspection system 100 to align each of the components of the stacked semiconductor assembly 105. Each layer may be a 2D IC that includes functional electrical devices (herein "devices") that are used in operation of the stacked semiconductor assembly 105. Each of the features are formed on non-functional portions of each layer. For example, the stacked semiconductor assembly 105 may be configured to include three layers: a base substrate 108, a first die 109, and a second die 110. However, the stacked semiconductor assembly 105 is not limited to three layers. For example, the stacked semiconductor assembly 105 may include two or more layers. The base substrate 108 may include a base feature 111. The first die 109 may include a first feature 112, and the second die 110 may include a second feature 114. The base substrate 108 may be aligned to the first die 109 based on the base feature 111 and the first feature 112. The second die 110 may be aligned to the first die 109 based on the second feature 114 and the first feature 112. Therefore, in one example, the base feature 111 is smaller in size than the first feature 112, which is smaller in size than the second feature 114. Therefore, the first die 109 may be aligned to the base substrate 108 by aligning the features, such as centering the base feature 111 within the first feature 112. The second die 110 may be aligned with the first die 109 by centering the second feature 114 within the first feature 112.

Each of the features within each die and within adjacent pairs of dies are positioned so that the features have a negligible effect on the operation of the devices of the stacked semiconductor assembly 105, and are used for the purposes of alignment. Each of the features within each die comprise a material, such as a metal, that provides a contrast relative to the base substrate and/or die mat (e.g., silicon) at the inspection wavelengths of light Undesirably positioned features within a die or within adjacent die can cause electrical shorts or capacitive coupling issues as high speed electrical signals are provided through non-physically contacting adjacent circuits within the stacked semiconductor assembly 105. In one example, if the features are formed on the device side (i.e., a front side) of a die, the features are formed in non-electrical sections away from the devices or non-electrical sections that are interleaved with the adjacent devices so that the features do not affect the functionally of the stacked semiconductor assembly 105. In another example, the features may be formed on the backside of each layer (opposite the device side).

In various embodiments, the controller 126 instructs the robot end effector system 106 to position the base substrate 108 onto the stage 104. The controller 126, includes a central processing unit (CPU) 133, a memory 134, and support circuits 135. The controller 126 is used to control the robot end effector system 106. The CPU is a general-purpose computer processor configured for use in an industrial setting for controlling the robot end effector system 106. The memory 134 described herein, which is generally non-volatile memory, can include random access memory, read-only memory, hard disk drive, or other suitable forms of digital storage, local or remote. The support circuits 135 are conventionally coupled to the CPU 133 and comprises cache, clock circuits, input/output subsystems, power supplied, and the like, and combinations thereof. Software instructions (program) and data can be coded and stored within the memory 134 for instructing a processor within the CPU 133.

Typically, the program, which is readable by the CPU 133 in the controller 126 includes code, which, when executed by the CPU 133, performs tasks relating to the alignment of layers of the stacked semiconductor assembly 105 described herein. The program may include instructions that are used to control the various hardware and electrical components within the optical inspection system 100 to perform the various process tasks and various process sequences used to implement the methods described herein. In one example, the program includes an image processing algorithm. In one embodiment, the program includes instructions that are used to perform one or more of the operations described below in relation to FIGS. 3-9.

The robot end effector system 106, which can include a robot arm motion assembly, is configured to transport, stack, and then align each layer of the stacked semiconductor assembly 105 based on instructions received from the controller 126. Therefore, the robot end effector system 106 is configured to move the die of the stacked semiconductor assembly 105 along the x-axis, the y-axis, and the z-axis. Additionally, the robot end effector system 106 is configured to rotate the die of the stacked semiconductor assembly about (around), the x-axis, the y-axis, and the z-axis.

Then the controller 126 next instructs the robot end effector system 106 to stack the first die 109 onto the base substrate 108 and the first die 109 is bonded to the base substrate 108. In one example, the first die 109 is bonded to the base substrate 108 using a dedicated tool such as a bonder or the like. The first die 109 and the base substrate 108 may be bonded using any suitable bonding process such as micro-bumping bonding, hybrid bonding, or the like. The imaging device captures an image of the stacked semiconductor assembly 105, after the first die 109 is bonded to the base substrate 108. The imaging device 101 captures an image of the stacked semiconductor assembly 105 by delivering light towards the stacked semiconductor assembly 105 (i.e., the base substrate 108 and the first die 109) and capturing an image, via an image sensor 140, based on reflected light (FIG. 2) or light transmitted through (FIG. 3) the stacked semiconductor assembly 105. Based on the captured image, the controller 126 may determine the location of the base feature 111 and first feature 112 and determine an overlay (OVL) measurement between the base feature 111 and the first feature 112. The OVL measurement may include the distances between a portion of the base feature 111 and a portion of the first feature 112 within the x-y plane (FIG. 1A) or with respect to the x and y axes. Based on the OVL measurement of the base feature 111 and the first feature 112, the controller 126 provides updated alignment instructions to the robot end effector system 106 when aligning a base substrate and a first die of an identical stacked semiconductor assembly. The updated alignment instructions may include instructions for the robot end effector system 106 and/or stage 104 actuators to shift and/or rotate the first die and/or the base substrate of the identical stacked semiconductor assembly so that the base feature and the first feature are aligned when bonding the first die and the base substrate of the identical stacked semiconductor assembly.

The controller 126 may then instruct the robot end effector system 106 to stack a second die 110 onto the first die 109. The second die 110 is bonded onto the first die 109. The imaging device 101 captures an image of the stacked semiconductor assembly 105, after bonding the second die 110 onto the first die 109, and using the image, the controller 126 determines a location of the first feature 112 and the second feature 114 and determines an OVL measurement between the first feature 112 and the second feature 114. The OVL measurement may include the distances between the first feature 112 and the second feature 114 within the x-y plane or with respect to the x and y axes. Based on the OVL measurement between the first feature 112 and the second feature 114, the controller 126 provides updated alignment instructions to the robot end effector system 106 when aligning a second die and a first die of an identical stacked semiconductor assembly. The updated alignment instructions may include instructions for the robot end effector system 106 and/or stage 104 actuators to shift and/or rotate the first die and/or the second die of the identical stacked semiconductor assembly so that the second feature and the first feature are aligned prior to bonding the first die and the second die of the identical stacked semiconductor assembly. In one example, as will be discussed further below, the robot end effector system 106 and/or stage 104 shifts/rotates the second die 110 until the first feature 112 is centered within the second feature 114.

Although the base feature 111 is described as being smaller in size than the first feature 112, which described as is smaller in size than the second feature 114, this is not intending to be limiting as to the scope of the disclosure provided herein, and is provided as example only.

Figure 1B:
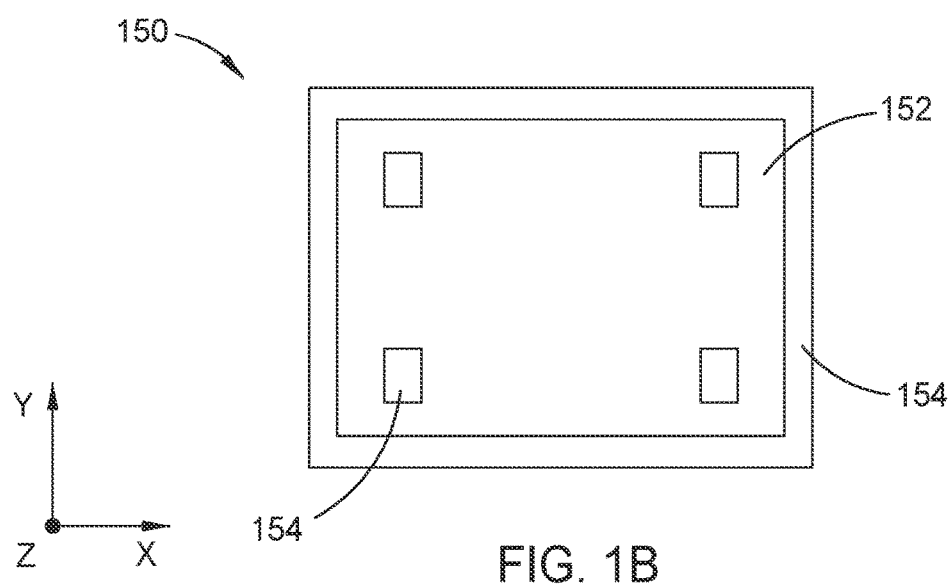
FIG. 1B is a top-down view of a portion of a die of a stacked semiconductor assembly positioned in the optical inspection system of FIG. 1A.

FIG. 1B illustrates a top-down view of a portion of a component 150 disposed within a stacked semiconductor assembly. The component 150 may correspond to any layer of a stacked semiconductor assembly, such as the stacked semiconductor assembly 105. For example, the component 150 may correspond to the base substrate 108, the first die 109, the second die 110, or any other layer of the stacked semiconductor assembly 105. As shown in FIG. 1B a front side of the component 150 (i.e., the device side) may include an electrical section 152 that includes functional IC devices and one or more non-electric circuit containing sections 154. The non-electric circuit containing sections 154 may surround the electrical sections 152, corresponding to a portion of the component 150 that is separate from the electrical sections 152, or may be interleaved with the electrical sections 152. As described above the features, such as the base feature 111, first feature 112, and second feature 114 that are used to align layers of the stacked semiconductor assembly 105, are formed within the non-electric circuit containing sections 154 in a manner such that they do not affect the functionality of the stacked semiconductor assembly 105. Therefore, the features used for alignment have negligible effect on the operation of the stacked semiconductor assembly 105, and are used for the purpose of aligning dies (layers) of the stacked semiconductor assembly 105.

Figure 2:
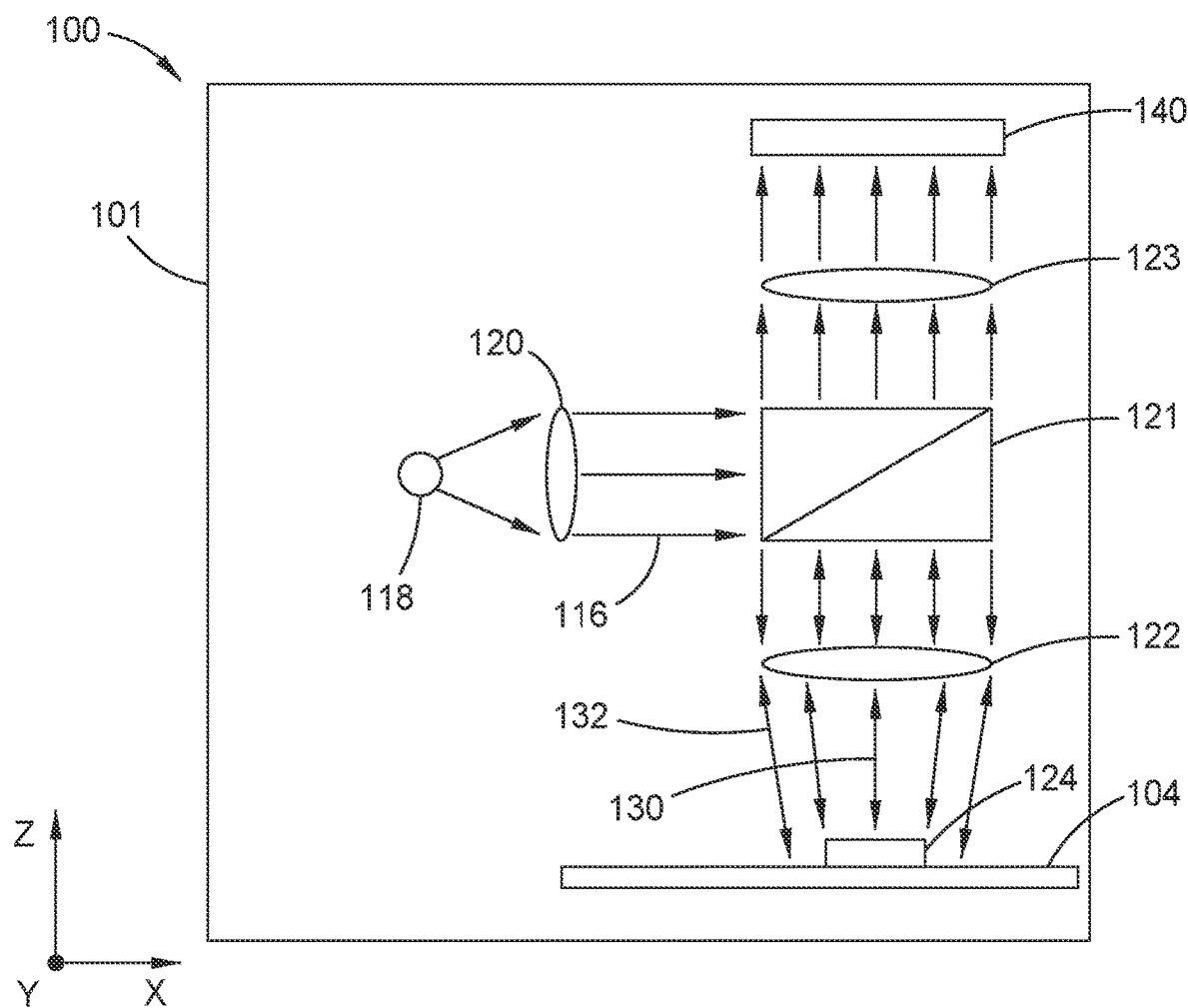
FIG. 2 is a more detailed cross-sectional view of a configuration of the optical inspection system 100, according to one or more embodiments.

FIG. 2 is a more detailed cross-sectional view of a configuration of the optical inspection system 100. In various embodiments, the imaging device 101 can include a light source 118, stage 104, beam splitter 121, a first lens 120, a second lens 122, a third lens 123, an imaging sensor 140. In various embodiments, input light beams 116 are provided by a light source 118 positioned above the stage 104, such as an infrared (IR) light source, that pass through a first lens 120 and a beam splitter 121. In some embodiments, the light source 118 is configured to generate a single wavelength of light or multiple wavelengths of light that can be transmitted through the sample 124, such as the infrared wavelengths for use with samples that include die that comprise a silicon material. In an embodiment, the first lens 120 is a large field lens having a measurement field size (or illumination area) that is slightly greater than a size of the light source 118.

The beams are directed from the beam splitter 121 to a second lens 122 where they are focused onto a sample 124 disposed on a stage 104. The stage 104 can include optical and motion control components, such as, for example, x-direction, y-direction and rotation actuators. In one example, the sample 124 may be the stacked semiconductor assembly 105 (FIG. 1A). A first portion 130 of beams of light exiting the beam splitter 121 are reflected off of the alignment features of the sample (e.g., the base feature 111, the first feature 112, and/or the second feature 114) and a second portion 132 of beams of light exiting the beam splitter 121 are reflected off of the remaining portions of the sample 124. The first portion 130 and the second portion 132 are reflected towards to the second lens 122 and are focused into the beam splitter 121. The beam splitter 121 directs the first portion 130 and the second portion 132 to an imaging sensor 140. In various embodiments, both portions of the reflected light directed by the beam splitter 121 to the imaging sensor 140 may be focused onto the imaging sensor 140 by the third lens 123. The imaging sensor 140, based on the received reflected light and contrast between the material of the feature(s) and the material of each layer of the stacked semiconductor assembly (e.g. the base substrate 108, the first die 109, and the second die 110) at the inspection wavelengths of light, can generate an image of the sample 124. Using the generated image and an image processing algorithm, the controller 126 (FIG. 1) may determine characteristics of the sample 124 such as the location and critical dimensions of features, and OVL measurements of the features. Using the determined characteristics, the controller 126 provides updated alignment instructions to the robot end effector system 106 to position and align the components of the an identical stacked semiconductor assembly (e.g., base substrate and/or die), which will be described in more detail below.

In an embodiment, the second lens 122 and the third lens 123 are large field lenses having a measurement field size (or illumination area) that is slightly greater than a size of the sample 124 so that full-sample images can be acquired by the imaging sensor 140 without scanning the light and/or moving the stage 104. The second lens 122 and the third lens 123 may be telecentric lenses so that light rays traveling from the second lens 122 to the sample 124 and from the third lens 123 to the imaging sensor 140 are approximately parallel to an optical axis that is substantially perpendicular to a surface of the sample 124. This provides substantially normal illumination over the entire sample 124 or across an entire measurement area. This can reduce measurement error since the illumination angles are approximately the same.

In some embodiments, the second lens 122 has a field size that is smaller than a diameter of the sample 124. In this case, an area (or measurement area) is imaged and the optics and/or the sample 124 may be moved and/or the optical module may be scanned to image adjacent fields. Depending on the application, a measurement area may be approximately the same size as a die or stepper field. Adjacent images may be stitched using known techniques to provide multi-field or full-sample images.

The imaging sensor 140 may be an area imaging sensor that includes one or more digital cameras (e.g., CCD based cameras) for capturing the light that is reflected from the sample 124. The imaging sensor 140 provides an image of the sample 124 based on the received light. The imaging sensor 140 may include a single camera in some embodiments that is configured to image the entire surface of the sample 124. The imaging sensor 140 may include multiple cameras in other embodiments that each image adjacent or slightly overlapping fields (or measurement areas) on the sample 124. Adjacent images may be stitched together using known techniques. Image resolution may be increased by using a higher resolution imaging sensor or using multiple imaging sensors that each image a smaller field. Using the images generated by the imaging sensor a controller 126 (FIG. 1A), using an image processing algorithm, can determine the location of features formed on the layers of the stacked semiconductor assembly and determine OVL measurements between the features. Based on the OVL measurements, the controller 126 determines updated alignment instructions a robot end effector system 106 (FIG. 1A) and/or stage 104 for aligning layers of an identical stacked semiconductor assembly. In one example, the updated alignment instructions include instructions to shift and/or rotate the different layers of the identical stacked semiconductor assembly along the x, y, and z axes based on the OVL measurements of the sample 124 (i.e., the stacked semiconductor assembly 105), which will be described in more detail below.

Die Alignment Method

Figure 4:
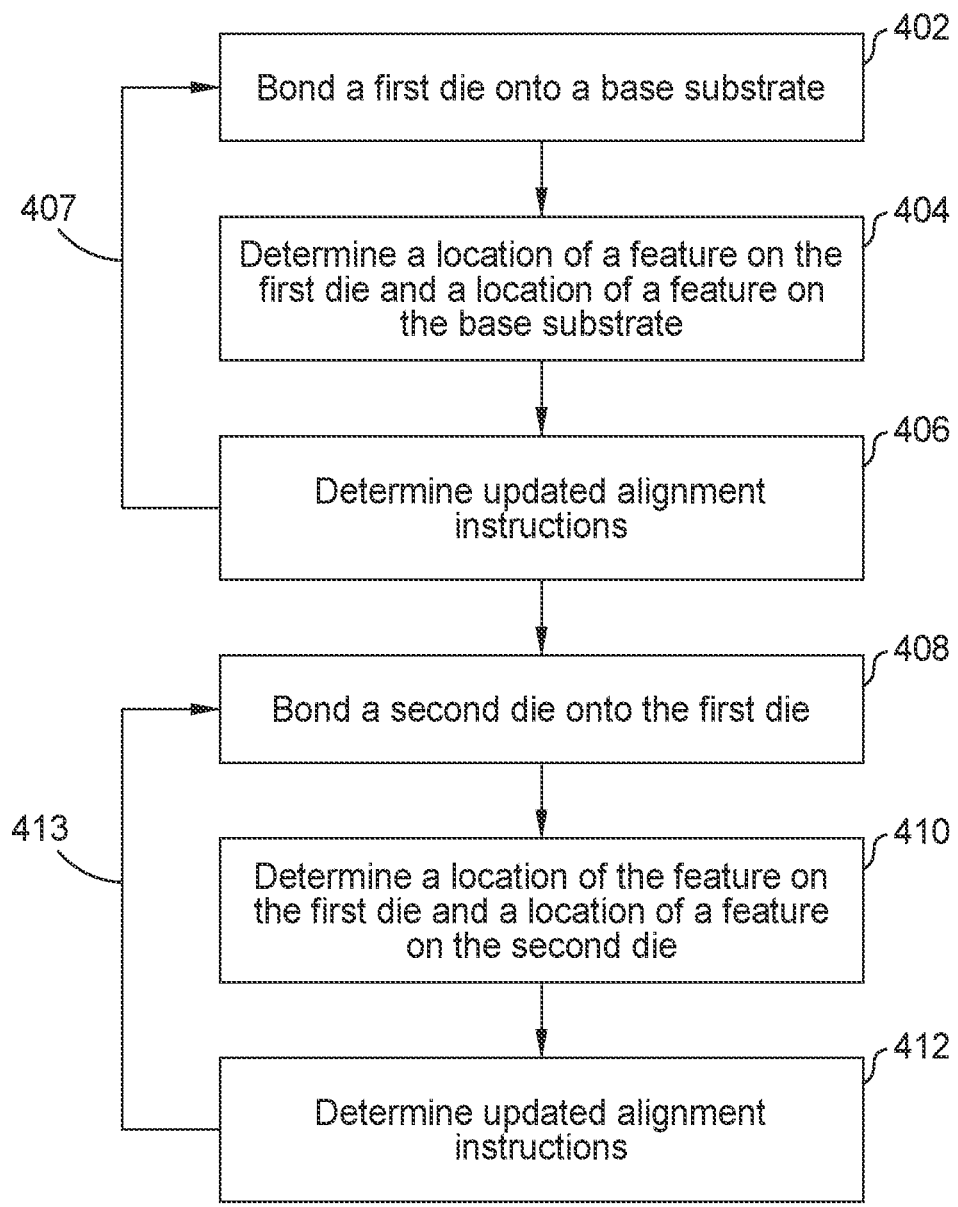
FIG. 4 is a diagram illustrating a method for forming a stacked semiconductor assembly, according to one or more embodiments.

FIG. 4 is a diagram illustrating a method 400 according to one or more embodiments, for forming a stacked semiconductor assembly. The method 400 may be performed using the optical inspection system 100 described above or any other optical inspection system. Aspects of the method 400 are schematically illustrated in FIGS. 5A-5E. FIGS. 5A-5E are schematic, cross-sectional views of a portion of a stacked semiconductor assembly 500 during a method for aligning the stacked semiconductor assembly 500.

At activity 402, a first die 514 is positioned and bonded onto on a base substrate 504. The base substrate may be positioned and secured on a stage 104 (FIGS. 1A-3) using the robot end effector system 106 (FIG. 1A). The first die 514 may be bonded to the base substrate 504 by any suitable bonding method, including but not limited to, micro-bumping bonding, hybrid bonding, or the like.

Figure 5A:
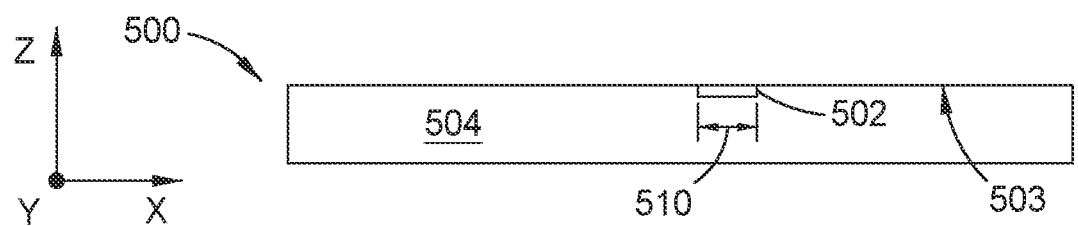
FIGS. 5A-5E are schematic, cross-sectional views of a portion of a stacked semiconductor assembly during a method of aligning the stacked semiconductor assembly, according to one or more embodiments.

As shown in FIG. 5A, a base feature 502 may be formed on a base substrate 504. In some embodiments, the base substrate 504 may include an interposer, bridging substrate, hybrid bonding substrate, or other similar substrate. The base substrate 504 may comprise any suitable material for forming a stacked semiconductor assembly including, but not limited to, silicon (Si), silicon dioxide ($SiO_2$), doped $SiO_2$, fused silica, quartz, silicon carbide (SiC), glass, or the like. As noted above, the base feature 502 is configured to have a negligible effect on the operation of the stacked semiconductor assembly, and is used for the purpose of aligning subsequent dies that are to be stacked over the base substrate 504. The base feature 502 may be formed on a base surface 503 of the base substrate 504. In one example, the base surface 503 may be the side of the base substrate 504 in which devices are formed (i.e., the front side of the base substrate 504). If the base feature 502 is formed on the front side, the base feature 502 may be formed on a non-electric circuit containing section 154 (FIG. 1B) of the base surface 503 of the base substrate 504 away (separate) from the devices. On the other hand, the base feature 502 may be formed on non-electric circuit containing sections 154 of the base substrate 504 interleaved with the die.

The base feature 502 may be formed by at least the following steps: patterning the front side of the base substrate 504 with the base feature 502 using any suitable lithography and etching method, depositing a material into the patterned base feature 502 such as a metal (e.g., aluminum, titanium, tantalum, tungsten) or other useful material that provides a contrast relative to the base substrate material (e.g., silicon) at the inspection wavelengths of light, and then performing a chemical mechanical planarization (CMP) on the front side of the base substrate 504. The base feature 502 may be formed on the front side of the base substrate 504 simultaneously with the devices or using a separate process.

In other examples, the base surface 503 may be the back side of the base substrate 504. In examples in which the base feature 502 is formed on the backside of the base substrate 504, the base feature 502 may be formed by at least the following steps: flipping the base substrate 504, grinding the back side of the base substrate 504 down to a certain thickness, patterning the back side of the base substrate 504 to form the base feature 502 using any suitable lithography and etching method, depositing a material into the base feature 502 such as a metal, and then performing a chemical mechanical planarization on the back side of the base substrate 504.

The base feature 502 may have any suitable cross-sectional shape that may be used for aligning layers of the stacked semiconductor assembly 500. For example, the base feature 502 may have a square, rectangular, circular, plus sign shaped cross-section, or the like. The base feature has a base critical dimension 510 that is measured relative to an alignment direction of the various components within the semiconductor assembly, such as a direction within the x-y plane (FIG. 5B).

Figure 5B:
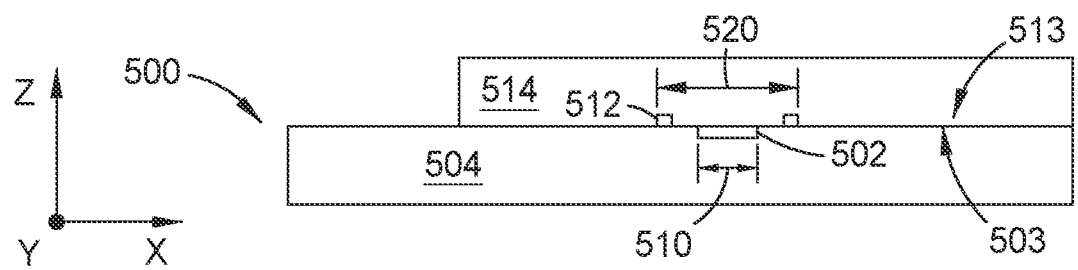

As shown in FIG. 5B, the first die 514 may include a first feature 512. The first feature 512 may be formed on a first surface 513 of the first die 514. The first die 514 may comprise any suitable material for forming a stacked semiconductor assembly. The first die 514 may be the same or a different material than the base substrate 504. In one example, the first surface 513 may be the side of the first die 514 in which IC devices are formed (i.e., the front side of the first die 514). If the first feature 512 is formed on the front side, the first feature 512 may be formed on a non-electric circuit containing section 154 (FIG. 1B) of the first surface 513 of the first die 514 away (separate) from the formed IC devices. On the other hand, the first feature 512 may be formed on non-electric circuit containing sections 154 of the first die 514 interleaved with the devices. The first feature 512 may be formed by at least the following steps: patterning the front side of the first die 514 with the first feature 512 using any suitable lithography and etching method, depositing a material into the first feature 512 such as a metal or other useful material that provides a contrast relative to the material from which the first die 514 is made, and then performing a chemical mechanical planarization on the front side of the first die 514. The first feature 512 may be formed on the front side of the first die 514 simultaneously with the devices or using a separate process.

In other examples, the first surface 513 may be the back side of the first die 514. In examples in which the first feature 512 is formed on the backside of the first die 514, the first feature 512 is formed by at least the following steps: flipping the first die 514, grinding the back side of first die 514 down to a certain thickness, patterning the back side of the first die 514 with the first feature 512 using any suitable lithography, etching or grinding method, depositing a material into the formed first feature 512 such as a metal, and then performing a chemical mechanical planarization on the back side of the first die 514.

The first die 514 and the base substrate 504 may be stacked in a manner such that the first surface 513 and the base surface 503 face (i.e., are directly adjacent to) one another.

Figure 5C:
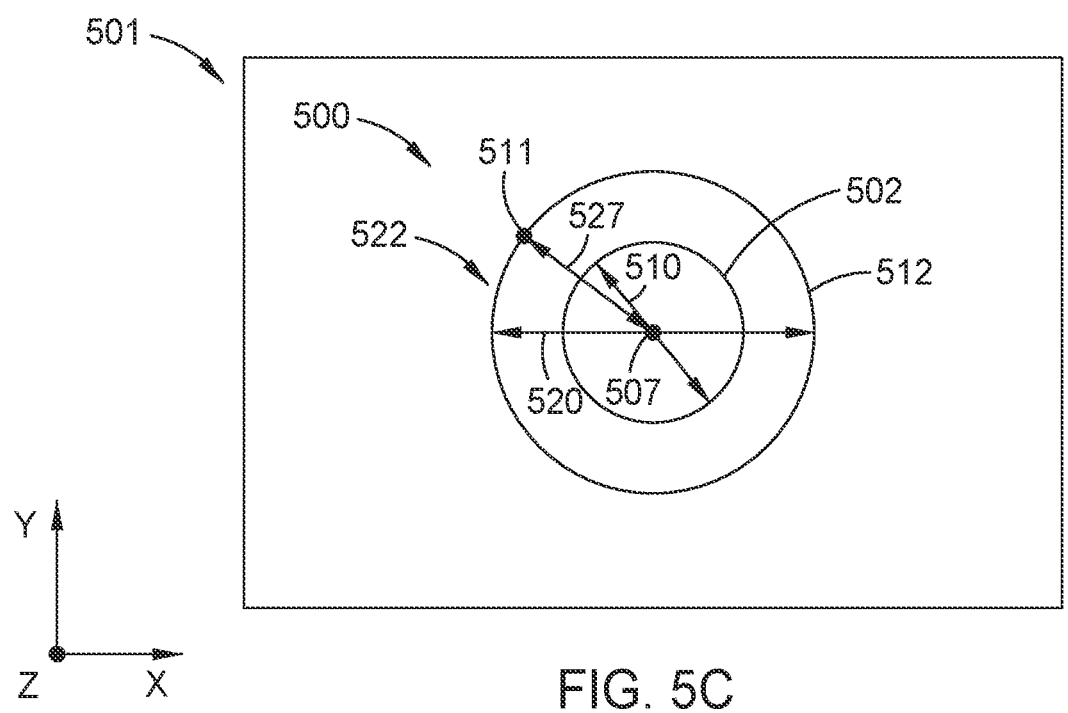
Figure 5D:
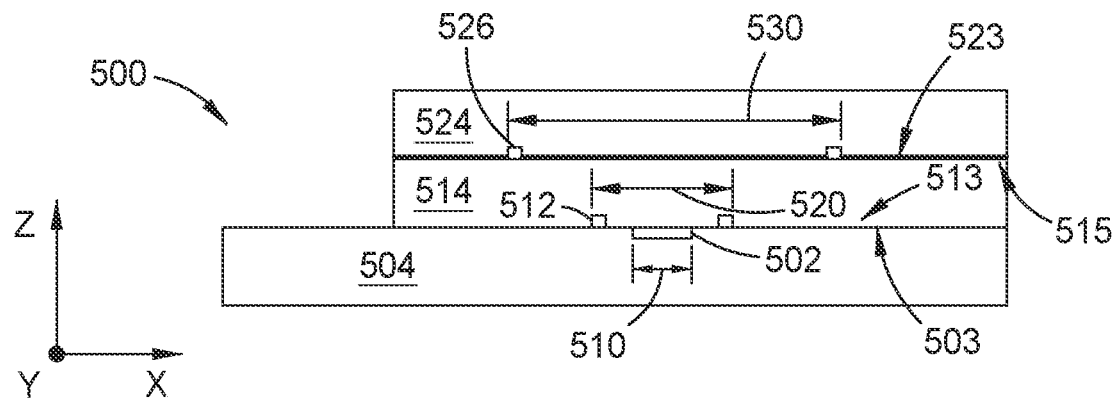

The first feature 512 may any suitable cross-sectional shape that may be used to align the first die 514 with the base substrate 504 and with a second die 524 (FIG. 5D). For example, the first feature 512 may have a square, rectangular, circular, plus sign shaped cross-section, or the like. The first feature 512 and the base feature 502 may have the same or different cross-sectional shapes.

In one example, the first feature 512 has a first critical dimension 520 that is measured relative to an alignment direction (e.g., x-y plane) of the first die 514 to the base substrate 504. In some embodiments, the first critical dimension 520 may be larger in size than the base critical dimension 510. Stated differently, from a perspective of a top-down view of an optical inspection system (FIG. 5C), such as optical inspection system 100, the base feature 502 may fit within the first feature 512 and may be used to align the first die 514 with the base substrate 504.

At activity 404, a relative displacement between a feature on the first die 514 and a feature on the base substrate 504 are determined. For example, using an optical inspection system, such as the optical inspection system 100, the relative displacement between the first feature 512 and the base feature 502 may be determined. As shown in FIG. 5C, the optical inspection system 100 generates an image 501 of the portion of the stacked semiconductor assembly 500. In one example, the image 501 is a top-down view of the portion of the stacked semiconductor assembly 500. In one example, the image 501 is parallel to a plane that is parallel to the base surface 503. The image 501 corresponds to a moment in time after the first die 514 is bonded onto the base substrate 504. The image 501 includes at least a portion of the base feature 502 and the first feature 512. In one example, the base feature 502 and the first feature 512 have circular-cross sectional shapes as seen when viewing the features in a direction that is normal to an alignment direction (e.g., direction in the x-y plane). Therefore, the image 501 includes two circles. The controller 126, based on the image 501 and using an image processing algorithm, may then determine the relative displacement between the base feature 502 and the first feature 512. The controller 126 may determine an OVL measurement between the first feature 512 and the base feature 502 based on the relative displacement between the first feature 512 and the base feature 502. In one example, the OVL measurement between the first feature 512 and the base feature 502 may include a first distance 527 measured from at least one point of interest (POI), such as POI 511, located on the outer perimeter surface 522 of the first feature 512 to a center 507 of the base feature 502. The POI can be determined based on an analysis of the images that is performed by one or more software applications running on the controller 126.

At activity 406, the controller 126 (FIG. 1) determines updated alignment instructions. In one example, the controller 126 saves the updated alignment instructions to the memory of controller 126 and provides the updated alignment instructions when stacking/bonding a first die to a base substrate of an identical stacked semiconductor assembly. In one example, the updated alignment instructions are based on the relative displacement between the feature on the first die 514 and the base feature 502 on the base substrate 504. The updated instructions cause a first die to be aligned to a base substrate of the identical stacked semiconductor assembly. For example, as illustrated by arrow 407, the method may repeat activities 402 and 404 and a first die is bonded to the base substrate of an identical (subsequent) stacked semiconductor assembly with the proper alignment based on the updated alignment instructions. Stated differently, the controller 126, based on the OVL measurement between the base feature 502 and the first feature 512 and using the robot end effector system 106 and/or stage 104, stacks the first die onto the base substrate of the identical semiconductor assembly so that the OVL measurement is equal to a pre-determined distance that is stored in the memory of the controller 126. For example, the updated alignment instructions cause the base substrate and the first die of the identical stacked semiconductor assembly to be stacked in a manner such that the base feature is centered within the first feature. For example, the updated alignment instructions include instructions for shifting and/or rotating the first die and/or the base substrate of the identical stacked semiconductor device along the x, y, and/or z axis until a center of the base feature (i.e., center 507) is centered within the first feature of the identical stacked semiconductor device. The pre-determined distance may be determined based on the first critical dimension 520. In some examples, the pre-determined distance is a fraction of the first critical dimension 520. For example, if the cross-sectional shape of the first feature 512 is a circle, the first distance 527 may be equal to the radius of the cross-sectional shape of the first feature 512, which is half of the first critical dimension 520 (i.e., the diameter of the first feature 512).

At activity 408, a second die 524 is stacked and bonded onto the first die 514. The second die 524 may be positioned onto the first die 514 using the robot end effector system 106. The second die 524 may be bonded to the first die 514 by any suitable bonding method, including but not limited to, micro-bumping bonding, hybrid bonding, or the like.

As shown in FIG. 5D, the second die 524 may include a second feature 526. The second feature 526 may be formed on a first surface 523 of the second die 524. In one example, the first surface 523 may be the side of the second die 524 in which devices are formed (i.e., the front side of the second die 524). The second die 524 and the first die 514 may be aligned in a manner such that the first surface 523 and a second surface 515 of the first die 514 face (i.e., are directly adjacent to) one another. If the second feature 526 is formed on the front side, the second feature 526 may be formed on a non-electric circuit containing region, such as the non-electric circuit containing section 154, of the first surface 523 so that it has a negligible effect on the functionality of the stacked semiconductor assembly 500. The second feature 526 may be formed by patterning the front side of the second die 524 with the second feature 526 using any suitable patterning process, depositing a material into the second feature 526 such as a metal, and then performing a chemical mechanical planarization. The second feature 526 may be formed on the front side of the second die 524 simultaneously with the devices or using a separate process.

In other examples, the first surface 523 may be the back side of the second die 524. In examples in which the second feature 526 is formed on the backside of the second die 524, the second feature 526 can be formed by grinding the back side of the second die 524 down to a certain thickness, patterning the back side of the second die 524 with the second feature 526 using any suitable patterning method, depositing a material into the second feature 526, such as a metal, and then performing a chemical mechanical planarization on the back side of the second die 524.

The second feature 526 may any suitable cross-sectional shape that may be used for aligning layers of a stacked semiconductor assembly on the base substrate 504. For example, the second feature 526 may have a square, rectangular, circular, plus sign shaped cross-section, or the like when viewed in a direction that is normal to the surface the second feature is formed in, such as the x-y plane (FIG. 5B or 5D). The second feature 526, the first feature 512, and/or the base feature 502 may have the same or different cross-sectional shapes.

In one example, the second feature 526 has a second critical dimension 530 that is measured in a direction that is parallel to the surface the second feature is formed in or in a direction that is perpendicular to the normal direction. The second critical dimension 530 may be larger than the first critical dimension 520. Stated differently, from a perspective of a top-down view of an optical inspection system, such as optical inspection system 100, the first feature 512 may fit within the second feature 526 and may be used to align the second die 524 with the first die 514. The second die 524 may comprise any suitable material for forming a stacked semiconductor assembly. The second die 524 may be the same or a different material than the base substrate 504 and/or the first die 514.

Figure 5E:
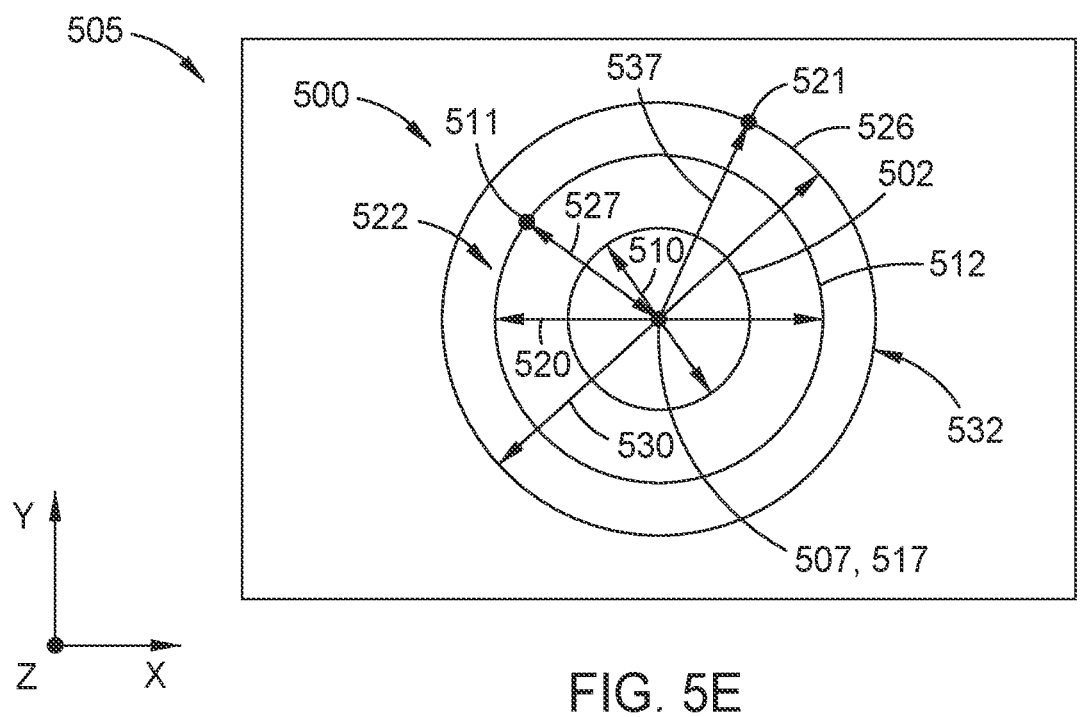

At activity 410, a relative displacement between the first feature 512 on the first die 514 and a location of the second feature 526 on the second die 524 are determined. As shown in FIG. 5E, the optical inspection system 100 generates an image 505 of the portion of the stacked semiconductor assembly 500. In one example, the image 505 is parallel to the plane that is parallel to the base surface 503. The image 505 corresponds to a moment in time after the second die 524 is bonded onto the first die 514. The image 505 includes at least a portion of the first feature 512 and the second feature 526. In one example, the second feature 526 has circular-cross sectional shape. Because the second critical dimension 530 is larger than the first critical dimension 520 which is larger than the base critical dimension 510, base feature 502, first feature 512, and second feature 526, depending on the transparency of the base substrate and die at the emitted light source wavelength, are all visible in image 505. Each of the features, which have a different reflectance or transmissivity from the material, within the base substrate or die, disposed around the features are visible because the cross-sectional shape of the base feature 502 can fit within the cross-sectional shape of the first feature 512, which can fit in the cross-sectional shape of the second feature 526. The controller 126 based on the image 505 and using the image processing algorithm may then determine the relative displacement between the first feature 512 and the second feature 526. The controller 126 may determine an OVL measurement between the first feature 512 and the second feature 526 based on the relative displacement between the first feature 512 and the second feature 526. The OVL measurement between the first feature 512 and the second feature 526 may include a second distance 537 measured from at least one point of interest (POI), such as POI 521, located on the outer perimeter surface 532 of the second feature 526 to a center 517 of the first feature 512 or a center 507 of the base feature 502.

At activity 412, the controller 126 (FIG. 1) determines updated alignment instructions. In one example, the controller 126 saves the updated alignment instructions to the memory of controller 126 and provides the updated alignment instructions when stacking/bonding a second die to a first die of an identical stacked semiconductor assembly. In one example, the updated alignment instructions are based on the relative displacement between the second feature 526 and the first feature 512. In another example, the updated alignment instructions are based on the relative displacement between the first feature 512 and the base feature 502. The updated alignment instructions cause a second die to be aligned to a first die of an identical stacked semiconductor assembly. For example, as illustrated by arrow 413, the method may repeat activities 408 and 410 and a second die is bonded to a first die of an identical (subsequent) stacked semiconductor assembly with the proper alignment based on the updated alignment instructions. Stated differently, the controller 126, based on the OVL measurement between the first feature 512 and the second feature 526 and using the robot end effector system 106 and/or stage 104, aligns the second die to the first die of the identical stacked semiconductor assembly so that the first feature 512 is centered within the second feature 526. For example, the updated alignment instructions include instructions to shift and/or rotate the second die and/or the first die of the identical stacked semiconductor assembly along the x, y, and/or z axis until a center of the first feature (i.e., the center 517) is centered within the second feature of the identical stacked semiconductor assembly. Stated differently, the second die is stacked onto the first die of the identical stacked semiconductor assembly such that a relative distance between the second die and the first die (i.e., the second distance 537) is equal to a pre-determined distance that is stored in the memory of the controller 126. The pre-determined distance may be determined based on the second critical dimension 530 in the same manner described above with respect to the first distance 527.

In some embodiments, a plurality of features are formed in and distributed across a surface of the base substrate or die to allow the correct position and alignment of die to the base substrate and/or die to other die. In one example, the base surface 503 and first surface 513 each includes at least two of base features 502 and first features 512 that are each positioned relative to each other in the +x-direction so that, when positioned correctly, the two concentric pairs of features set the x-y position and angular alignment of the first die 514 to the base substrate 504. Thus, in some embodiments, activity 412 can include the additional activity of comparing the position of more than one pair of mating features to properly position and align a die to the base substrate or a first die to a second die of an identical stacked semiconductor assembly.

Alternative Die Alignment Method

FIGS. 6A-6E are schematic, cross-sectional views of a portion of a stacked semiconductor assembly 600 during a method for forming a stacked semiconductor assembly. FIGS. 6A-6E are described with reference to FIG. 4.

At activity 402, a first die 614 is positioned and bonded onto a base substrate 604. The base substrate 604 may be positioned and secured on a stage 104 (FIGS. 1A-3) using the robot end effector system 106 (FIG. 1A) and/or actuators coupled to the stage 104.

As shown in FIG. 6A, a feature 602 having a critical dimension 610 may be formed on a base substrate 604. In some embodiments, the base substrate 604 may include an interposer, bridging substrate, hybrid bonding substrate, or other similar substrate. The base substrate 604 may comprise any suitable material for forming a stacked semiconductor assembly including, but not limited to, silicon (Si), silicon dioxide (SiO$_2$), doped SiO$_2$, fused silica, quartz, silicon carbide (SiC), glass, or the like. As noted above, the feature 602 is configured to have a negligible effect on the operation of the stacked semiconductor assembly 600, and is used for the purpose of aligning subsequent dies that are to be stacked over the base substrate 604. The feature 602 may be formed on a base surface 603 of the base substrate 604. As described above, the base surface 603 may be a front side or a back side of the base substrate 604. The feature 602 may be formed in the same manner described with respect to base feature 502. The feature 602 may any suitable cross-sectional shape that may be used for aligning additional die within a stacked semiconductor assembly on the base substrate 604. For example, the feature 602 may have a square, rectangular, circular, plus sign shaped cross-section, or the like.

As shown in FIG. 6B, a first die 614 may include a feature 612 formed on a first surface 613 of the first die 614 and a feature 626 formed on a second surface 615 of the first die 614. The second surface 615 being on the opposite side of the first die 614 than the first surface 613. The first die 614 may comprise any suitable material for forming a stacked semiconductor assembly. The first die 614 may be the same or a different material than the base substrate 604. In one example, the feature 612 has a critical dimension 620, and the feature 626 has a critical dimension 621 that are measured relative to an alignment direction (e.g., x-y plane) of the first die 614 to the base substrate 604. In some embodiments, the critical dimension 621 may be larger than the critical dimension 620. The critical dimension 620 may be smaller than the critical dimension 610. The critical dimension 610 may or may not be equal to the critical dimension 621.

The first die 614 and the base substrate 604 may be stacked in a manner such that the first surface 613 and the base surface 603 face (i.e., are directly adjacent to) one another. In some embodiments, the first die 614 and the base substrate 604 are aligned based on features 602 and 612. The first die 614 and the base substrate 604 may be aligned by centering the feature 612 within feature 602. Feature 612 may be positioned on the first surface 613 in a manner such that when it is centered within feature 602, the base substrate 604 and the first die 614 are aligned. In one example, the feature 626 is used to align the first die 614 with a second die 624 (FIG. 6D). Therefore, feature 626 may be horizontally offset from feature 612 by a horizontal distance 619 that is measured relative to an alignment direction of various components within the semiconductor assembly, such as a direction in the x-y plane, so that feature 626 does not cover feature 602 in an image captured by an optical inspection system 100 when aligning the first die 614 and the second die 624 (FIG. 6D). The horizontal distance 619 may be measured between a center line 608 and a center line 609. The center line 608 may be orientated in the vertical direction (i.e., the z-axis) and intersect with the center of feature 612. The center line 609 may be orientated in the vertical direction and intersect with the center of feature 626. As illustrated in FIG. 6B, if the first die 614 and the base substrate 604 are aligned, the center line 608 may be coincidental with a centerline 607. The centerline 607 may be orientated in the vertical direction and intersects with the center of feature 602.

In one example, feature 602 and feature 626 may have a same cross-sectional shape and equal critical dimensions. In another example, feature 612 may have a same or different cross-sectional shape than feature 602 and/or feature 626.

At activity 404, a relative displacement between the features on the first die 614 and on the base substrate 604 are determined. For example, using an optical inspection system, such as the optical inspection system 100, the relative displacement of the feature 612 to the feature 602 may be determined. As shown in FIG. 6C, the optical inspection system 100 generates an image 601 of the portion of the stacked semiconductor assembly 600. In one example, the image 601 is a top-down view of the portion of the stacked semiconductor assembly 600. In one example, the image 601 is parallel to a plane that is parallel to the base surface 603. The image 601 corresponds to a moment in time after the first die 614 is bonded onto the base substrate 604. In one example, the image 601 includes at least a portion of the feature 602 and the feature 612. In another example, the image 601 includes at least a portion of feature 626. In one example, each of the features have circular-cross sectional shapes as seen when viewing the features in a direction that is normal to an alignment direction (e.g., direction in the x-y plane). Advantageously, because the critical dimension 620 is less than critical dimension 610, feature 612 does not cover feature 602 even though feature 612 is positioned above feature 602. Additionally, because feature 626 is offset horizontally from feature 612, feature 626 does not cover feature 612. The controller 126 may determine the relative displacement between the feature 602 and the feature 612 based on the image 601 using the image processing algorithm. The controller 126 may determine an OVL measurement between the feature 612 and the feature 602 based on the relative displacement between the feature 612 and the feature 602. In one example, the OVL measurement between the feature 612 and the feature 602 may include a first distance 627 measured from at least one point of interest (POI), such as POI 611, located on the outer perimeter surface 622 of the feature 612 to the centerline 607. The POI 611 can be determined based on an analysis of the images that is performed by one or more software applications running on the controller 126.

At activity 406, the controller 126 (FIG. 1) determines updated alignment instructions. In one example, the controller 126 saves the updated alignment instructions to the memory of controller 126 and provides the updated alignment instructions when stacking/bonding a first die to a base substrate of an identical stacked semiconductor assembly. In one example, the updated alignment instructions are based on the relative displacement between the feature 602 and the feature 612. The updated alignment instructions cause a first die to be aligned to a base substrate of the identical stacked semiconductor assembly. For example, as illustrated by arrow 407, the method may repeat activities 402 and 404 and a first die is bonded to the base substrate of an identical (subsequent) stacked semiconductor assembly with the proper alignment based on the updated alignment instructions. Stated differently, the controller 126, using the robot end effector system 106 and/or stage 104, stacks the first die onto the base substrate of the identical stacked semiconductor assembly so that the OVL measurement between the feature 612 and the feature 602 of the identical stacked semiconductor assembly is equal to a predetermined distance that is stored in the memory of the controller 126. In some embodiments, the first die 614 and/or the base substrate 604 is shifted and/or rotated along the x, y, and/or z axis until the feature 612 is centered within the feature 602. For example, the first die is stacked onto the base substrate of the identical stacked semiconductor assembly so that the OVL measurement between the feature 612 and the feature 602 (i.e., the first distance 627) is equal to a first predetermined distance away from the centerline 607 of the identical stacked semiconductor assembly. The first predetermined distance may be determined based on the critical dimension 610 and stored in the memory of the controller 126. In some examples, the first pre-determined distance is a fraction of the critical dimension 610. For example, if the cross-sectional shape of the feature 602 is a circle, the first pre-determined distance may be equal to the radius of the cross-sectional shape of the feature 602, which is half of the critical dimension 610 (i.e., the diameter of the feature 602). Furthermore, the feature 626 is located at the horizontal distance 619 away from center line 609.

At activity 408, a second die 624 is stacked and bonded onto the first die 614. The second die 624 may be positioned onto the first die 614 using the robot end effector system 106.

As shown in FIG. 6D, the second die 624 may include a feature 628 formed on a first surface 623 of the second die 624, and a feature 630 formed on a second surface 625 of the second die 624. The second surface 625 being on the opposite side of the second die 624 than the first surface 623. The feature 628 may have a critical dimension 640, and the feature 630 may have a critical dimension 641 that are measured in a direction that is parallel to the surface that the features 628 and 630 are formed in or in a direction that is perpendicular to the normal direction. The critical dimension 641 may be larger than the critical dimension 640. The critical dimension 640 may be smaller than the critical dimension 621. The critical dimension 610, the critical dimension 621, and the critical dimension 641 may or may not be equal to each other. The second die 624 and the first die 614 may be positioned in a manner such that the second surface 615 and the first surface 623 face (i.e., are directly adjacent to) one another. In one example, a second die and a first die of an identical stacked semiconductor assembly may be aligned based on the features 626 and 628. Feature 628 is positioned on the first surface 623 in a manner such that when it is centered within feature 626, the second die 624 and the first die 614 are aligned. Feature 630 may be offset from feature 628 by a horizontal distance 629 that is measured relative to an alignment direction of various components within the semiconductor assembly, such as a direction in the x-y plane. The horizontal distance 629 may be measured between the center line 616 and a center line 617. The center line 616 is orientated in the vertical direction and intersects with the center of feature 628. As illustrated in FIG. 6D, if the second die 624 and the first die 614 are aligned, the center line 616 is coincidental with a center line 609. The center line 617 may be orientated in the vertical direction and intersects with the center of feature 630. Horizontal distances 619 and 629 may be different or equal to one another.

At activity 410, a relative displacement between a feature on the first die 614 and a feature on the second die 624 are determined. As shown in FIG. 6E, the optical inspection system 100 generates an image 605 of the portion of the stacked semiconductor assembly 600. In one example, the image 605 is a top-down view of the portion of the stacked semiconductor assembly 600. In one example, the image 605 is parallel to the plane that is parallel to the base surface 503. The image 605 corresponds to a moment in time after the second die 624 is bonded onto or over the first die 614. In one example, the image 605 includes at least a portion of the features 602, 612, 626, and 628. In another example, the image 605 includes at least a portion of each of the features formed on the base substrate 604 and the first die 614.

In one example, the features 602, 612, 626, 628, and 630 have circular-cross sectional shapes. The critical dimension 640 is less than critical dimension 621, thus, feature 628 does not cover feature 626 even though feature 628 is positioned above feature 626. Additionally, because feature 630 is offset horizontally from feature 628, feature 630 does not cover feature 628. Furthermore, because features 602 and 612 are horizontally offset from features 626, 628, and 630, features 626, 628, and 630 do not cover features 602 and 612. Because the critical dimension 620 is smaller than the critical dimension 610, feature 612 does not cover feature 602. Advantageously, depending on the transparency of the base substrate and die at the emitted light source wavelength, each of the features can be viewed in image 605.

In one example, the controller 126 may then determine the relative displacement between at least the features 626 and 628 using image 605. The controller 126, using an image processing algorithm, may determine an OVL measurement between the feature 626 and the feature 628 based on the relative displacement between the feature 626 and the feature 628. The OVL measurement between the feature 626 and the feature 628 may include a second distance 637 measured from at least one point of interest (POI), such as POI 631, located on the outer perimeter surface 632 of feature 626 to the center line 616. In another example, as described above an OVL measurement between features 602 and 612 may be determined using image 605.

At activity 412, the controller 126 (FIG. 1) determines updated alignment instructions. In one example, the controller 126 saves the updated alignment instructions to the memory of controller 126 and provides the updated alignment instructions when stacking/bonding a second die to a first die of an identical stacked semiconductor assembly. In one example, the updated alignment instructions are based on the relative displacement between the feature 626 and the feature 628. The updated alignment instructions cause a second die and a first die of the identical stacked semiconductor assembly to be aligned. For example, as illustrated by arrow 413, the method may repeat activities 408 and 410 and a second die is bonded to a first die of an identical (subsequent) stacked semiconductor assembly with the proper alignment based on the updated alignment instructions. Stated differently, the controller 126 using the robot end effector system 106 and/or stage 104, aligns the second die and the first die of the identical stacked semiconductor assembly based on the OVL measurement between the feature 626 and the feature 628. For example, the updated alignment instructions include instructions to shift and/or rotate the second die and/or the first die of the identical stacked semiconductor assembly along the x, y, and/or z axis until the feature 628 is centered within the feature 626 of the identical stacked semiconductor assembly. Stated differently, the second die is stacked onto the first die of the identical stacked semiconductor assembly so that the second distance 637 is a second pre-determined distance away from the center line 609. The second pre-determined distance may or may not be equal to the first pre-determined distance and stored in the memory of the controller 126. This process may be repeated for each layer of the stacked semiconductor assembly 600.

In some embodiments, a plurality of features are formed in and distributed across a surface of the base substrate or die to allow the correct position and alignment of die to the base substrate and/or die to other die. For example, the base surface 603 and first surface 613 each includes at least two of features 602 and features 612 that are each positioned relative to each other in the +x-direction so that, when positioned correctly, the two concentric pairs of features set the x-y position and angular alignment of the first die 614 to the base substrate 604. In another example, the second surface 615 and the first surface 623 includes at least two of features 626 and two of features 628 that are each positioned relative to each other in the +x-direction so that, when positioned correctly, the two concentric pairs of features set the x-y position and angular alignment of the second die 624 to the first die 614.

Thus, in some embodiments, activity 412 can include the additional activity of comparing the position of more than one pair of mating features to properly position and align a die to the base substrate or a first die to a second die of the identical stacked semiconductor assembly.

Alternative Die Alignment Method

FIGS. 7A-7E are schematic, cross-sectional views of a portion of a stacked semiconductor assembly 700 during a method for forming the stacked semiconductor assembly 700. FIGS. 7A-7E are described with reference to FIG. 4.

At activity 402, a first die 714 is positioned and bonded onto a base substrate 704. The base substrate 704 may be positioned and secured on a stage 104 (FIGS. 1A-3) using the robot end effector system 106 (FIG. 1A).

Figure 7A:
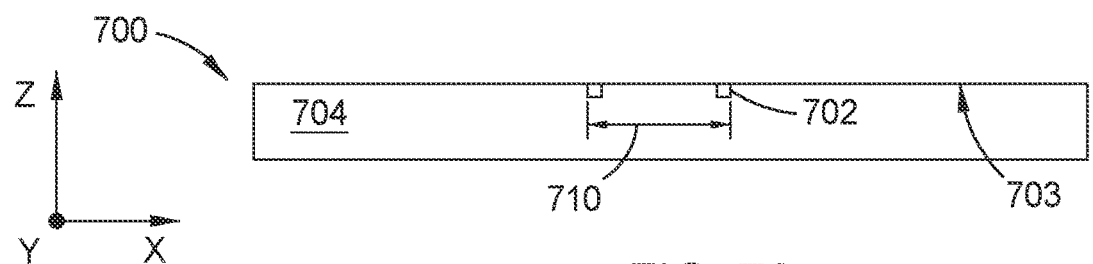
FIGS. 7A-7E are schematic, cross-sectional views of a portion of stacked semiconductor assembly during a method of forming the stacked semiconductor assembly, according to one or more embodiments.

As shown in FIG. 7A, a feature 702 having a critical dimension 710 may be formed on a base substrate 704. The base substrate 704 may comprise any suitable material for forming a stacked semiconductor assembly. In some embodiments, the base substrate 504 may include an interposer, bridging substrate, hybrid bonding substrate, or other similar substrate. The base substrate 704 may comprise any suitable material for forming a stacked semiconductor assembly including, but not limited to, silicon (Si), silicon dioxide ($SiO_2$), doped $SiO_2$, fused silica, quartz, silicon carbide (SiC), glass, or the like. As noted above the feature 702 is configured to have a negligible effect on the operation of the stacked semiconductor assembly 700, and is used for the purpose of aligning subsequent dies that are to be positioned over the base substrate 704. The feature 702 may be formed on a base surface 703 of the base substrate 704. In one example, the base surface 703 may be the side of the base substrate 704 in which devices are formed (i.e., the front side of the base substrate 704). If the feature 702 is formed on the front side, the feature 702 may be formed on a non-electric circuit containing sections 154 of the base surface 703 of the base substrate 704 of the base substrate 504 interleaved with the die. The feature 702 may be formed on the front side of the base substrate 704 simultaneously with the IC devices formed thereon or during a separate process sequence.

In other examples, the base surface 703 may be the back side of the base substrate 704. The feature 702 may be formed in the same manner as base feature 502 and feature 602.

The feature 702 may have any suitable cross-sectional shape that may be used for aligning layers of the stacked semiconductor assembly 700. For example, the feature 702 may have a square, rectangular, circular, plus sign shaped cross-section, or the like. The feature 702 has a critical dimension 710 that is measured relative to an alignment direction of the various components within the semiconductor assembly, such as a direction within the x-y plane (FIG. 5B).

Figure 7B:
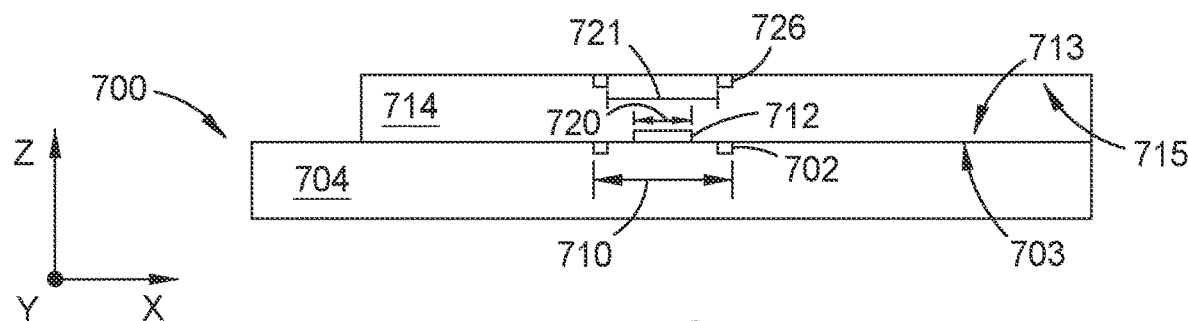

As shown in FIG. 7B, a first die 714 may be stacked onto the base substrate 704. The first die 714 includes a feature 712 formed on a first surface 713 of the first die 714 and a feature 726 formed on a second surface 715 of the first die 714. The second surface 715 being on the opposite side of the first die 714 than the first surface 713. The feature 712 may have a critical dimension 720, and the feature 726 may have a critical dimension 721 that are measured relative to an alignment direction (e.g., x-y plane) of the first die 714 to the base substrate 704. The critical dimension 721 may be equal to the critical dimension 710. The critical dimension 721 may be larger than the critical dimension 720. The critical dimension 720 may also be smaller than the critical dimension 710.

The first die 714 and the base substrate 704 may be positioned in a manner such that the first surface 713 and the base surface 703 face (i.e., are directly adjacent to) one another. In one example, a first die and a base substrate of an identical stacked semiconductor assembly are aligned based on features 702 and 726. The first die and the base substrate of the identical stacked semiconductor assembly are aligned by covering feature 702 with feature 726 of the identical stacked semiconductor assembly in an image captured by an optical inspection system, such as an optical inspection system 100. Feature 726 is positioned on the first die 714 in a manner such that when feature 726 covers feature 702 in the image captured by the optical inspection system 100, the base substrate 704 and the first die 714 are aligned. In one example, features 702, 712, and 726 may have a same cross-sectional shape and equal critical dimensions. In another example, features 702, 712, and 726 may have the same or different cross-sectional shapes.

Figure 7C:
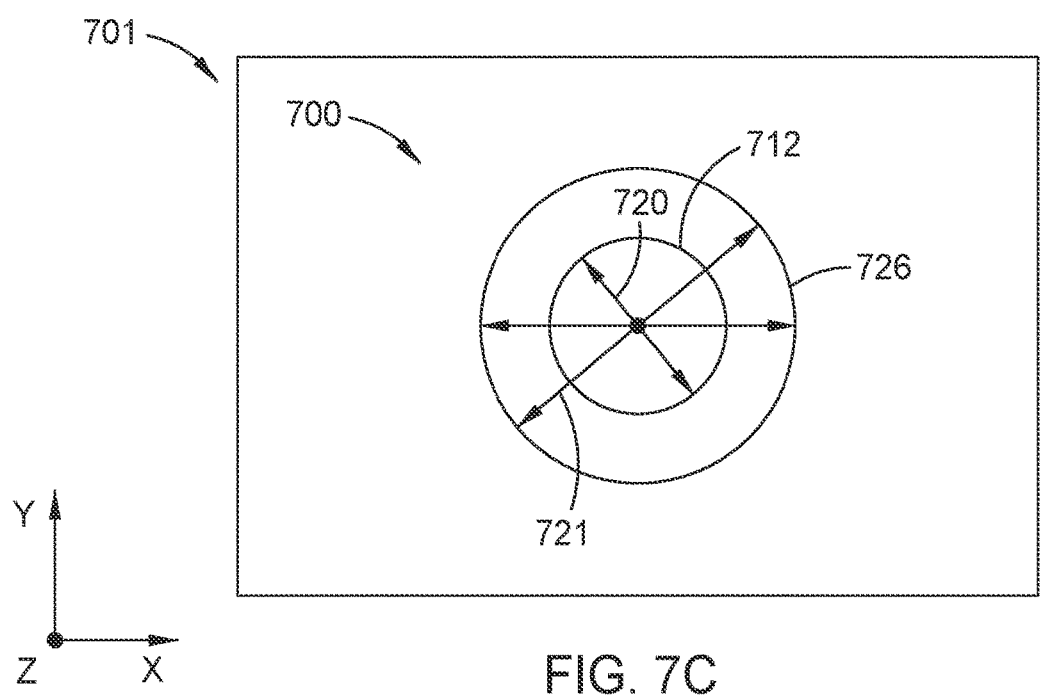

At activity 404, a relative displacement between a feature on the first die 714 and a feature on the base substrate 704 are determined. For example, using an optical inspection system, such as the optical inspection system 100, the location of the feature 726 and the location of the feature 702 may be determined. As shown in FIG. 7C, the optical inspection system 100 generates an image 701 of the portion of a stacked semiconductor assembly 700. In one example, the image 701 is a top-down view of the portion of the stacked semiconductor assembly 700. In one example, the image 701 is parallel to a plane that is parallel to the base surface 703. The image 701 corresponds to a moment in time after the first die 714 is bonded onto the base substrate 704. In one example, the features 702, 712, and 726 have circular-cross sectional shapes as seen when viewing the features in a direction that is normal to an alignment direction (e.g., direction in the x-y plane). The controller 126, based on the image 701, may then determine the relative location of the feature 702 and the feature 726. The controller 126 may determine an OVL measurement (not shown) corresponding to a distance between the feature 702 and the feature 726 based on the relative location of the feature 702 and the feature 702.

At activity 406, the controller 126 (FIG. 1) determines updated alignment instructions. In one example, the controller 126 saves the updated alignment instructions to the memory of controller 126 and provides the updated alignment instructions when stacking/bonding a first die to a base substrate of an identical stacked semiconductor assembly. In one example, the updated alignment instructions are based on the relative displacement between the feature 726 and the feature 702. In one example, the updated alignment instructions cause the feature 726 to completely cover feature 702 of the identical stacked semiconductor device. For example, as illustrated by arrow 407, the method may repeat activities 402 and 404 and a first die is bonded to the base substrate of an identical (subsequent) stacked semiconductor assembly with the proper alignment based on the updated alignment instructions. As shown in FIG. 7C, the base substrate 704 and/or the first die 714 are aligned when the feature 702 is no longer visible in image 701.

At activity 408, a second die 724 is positioned and bonded onto the first die 714. The second die 724 may be positioned onto the first die 714 using the robot end effector system 106.

Figure 7D:
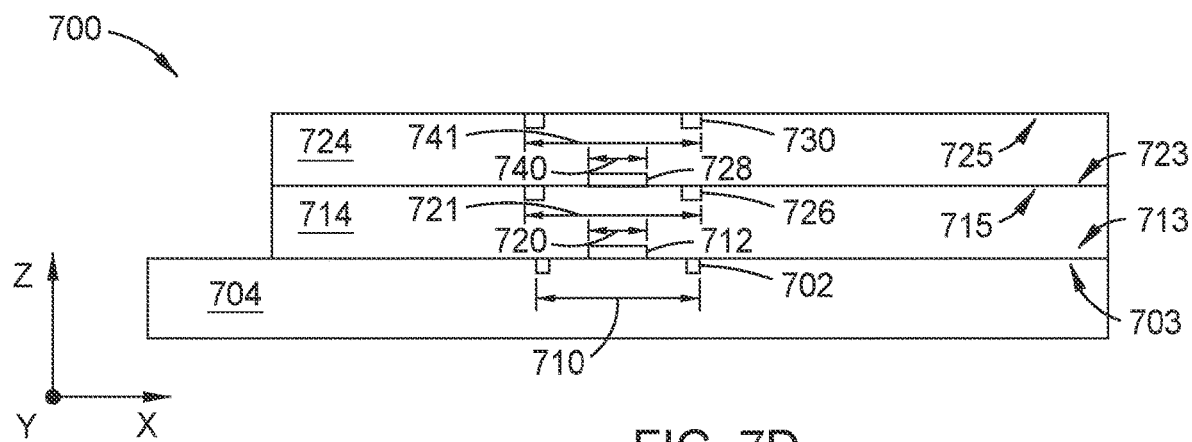

As shown in FIG. 7D, a second die 724 may be stacked and bonded onto the first die 714. The second die 724 includes a feature 728 formed on a first surface 723 of the second die 724 and a feature 730 formed on a second surface 725 of the second die 724. The second surface 725 being on the opposite side of the second die 724 than the first surface 723. The feature 728 may have a critical dimension 740 that is measured relative to an alignment direction (e.g., x-y plane) of the second die 724 to the first die 714. The feature 730 may have a critical dimension 741 that is measured relative to an alignment direction (e.g., x-y plane) of the second die 724 to the first die 714. The critical dimension 741 may be equal to the critical dimension 721. The critical dimension 740 may equal to the critical dimension 720.

The second die 724 and the first die 714 may be stacked in a manner such that the second surface 715 and the first surface 723 face (i.e., are directly adjacent to) one another. In one example, a second die and a first die of an identical stacked semiconductor assembly are aligned based on features 726 and 730. The second die 724 and the first die 714 are aligned when feature 726 is covered with feature 730 in an image captured by optical inspection system 100. Feature 730 is positioned on the second die 724 in a manner such that when feature 730 covers feature 726 in the image captured by the optical inspection system 100, the second die 724 and the first die 714 are aligned. In one example, features 702, 712, 726, 728, and 730 may have a same cross-sectional shape and equal critical dimensions. In another example, features 702, 712, 726, 728, and 730 may have the same or different cross-sectional shapes.

Figure 7E:
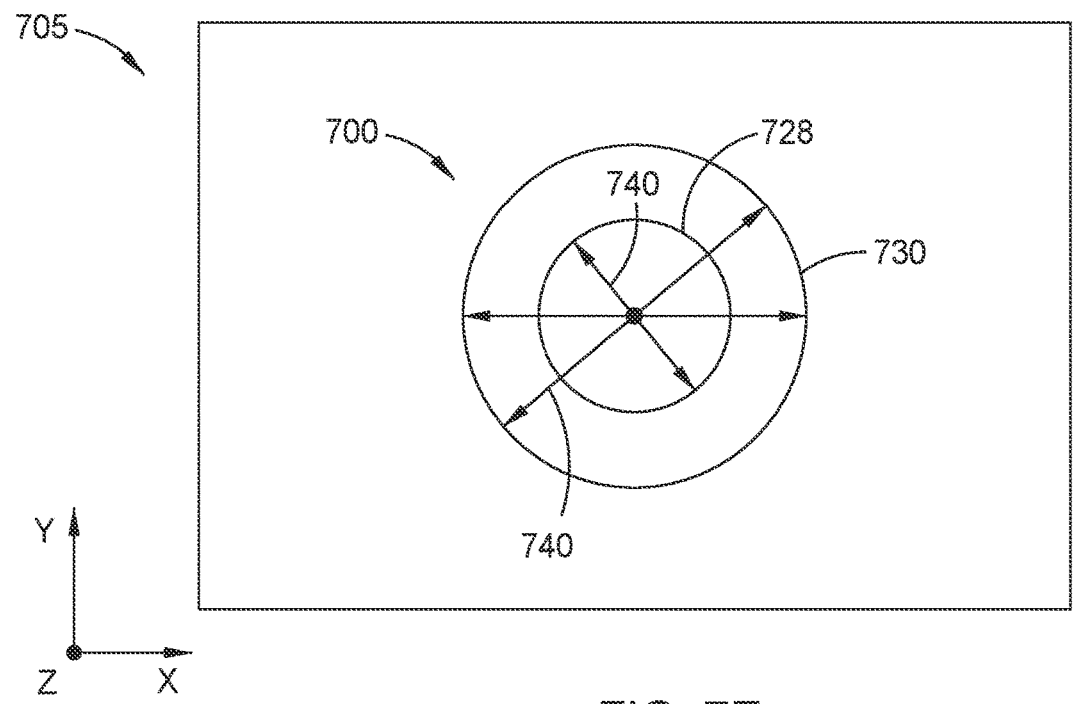

At activity 410, a relative displacement between a feature on the first die 714 and a feature on the second die 724 are determined. For example, using an optical inspection system, such as the optical inspection system 100, the relative displacement between the feature 726 and the location of the feature 730 may be determined. As shown in FIG. 7E, the optical inspection system 100 generates an image 705 of the portion of a stacked semiconductor assembly 700. In one example, the image 705 is a top-down view of the portion of the stacked semiconductor assembly 700. In one example, the image 705 is parallel to the plane that is parallel to the base surface 703. The image 705 corresponds to a moment in time after the second die 724 is bonded onto the first die 714. In one example, the features 702, 712, 726, 728, and 730 have circular-cross sectional shapes. The controller 126, based on the image 705, may then determine the relative locations of the feature 726 and the feature 730 using the image processing algorithm. The controller 126 may determine an OVL measurement (not shown) corresponding to a distance between the feature 726 and the feature 730 based on the relative displacement between the feature 726 and the feature 730.

At activity 412, the controller 126 (FIG. 1) determines updated alignment instructions. In one example, the controller 126 saves the updated alignment instructions to the memory of controller 126 and provides the updated alignment instructions when stacking/bonding a second die to a first die of an identical stacked semiconductor assembly. In one example, the updated alignment instructions are based on the relative displacement between the feature 728 and the feature 730. The updated alignment instructions cause a second die to be aligned to the first die of the identical stacked semiconductor assembly. In one example, the updated alignment instructions cause the feature 730 to complexly cover feature 726 of the identical stacked semiconductor device. For example, as illustrated by arrow 413, the method may repeat activities 408 and 410 and a second die is bonded to a first die of an identical (subsequent) stacked semiconductor assembly with the proper alignment based on the updated alignment instructions.

In some embodiments, a plurality of features are formed in and distributed across a surface of the base substrate or die to allow the correct position and alignment of die to the base substrate and/or die to other die. For example, the base surface 703 and first surface 713 each includes at least two of features 702 and features 712 that are each positioned relative to each other in the +x-direction so that, when positioned correctly, the two concentric pairs of features set the x-y position and angular alignment of the first die 714 to the base substrate 704. In another example, the second surface 715 and the first surface 723 includes at least two of features 726 and two of features 728 that are each positioned relative to each other in the +x-direction so that, when positioned correctly, the two concentric pairs of features set the x-y position and angular alignment of the second die 724 to the first die 714.

Thus, in some embodiments, activity 412 can include the additional activity of comparing the position of more than one pair of mating features to properly position and align a die to the base substrate or a first die to a second die of the identical stacked semiconductor device.

Alternative Die Alignment Method

Figure 3:
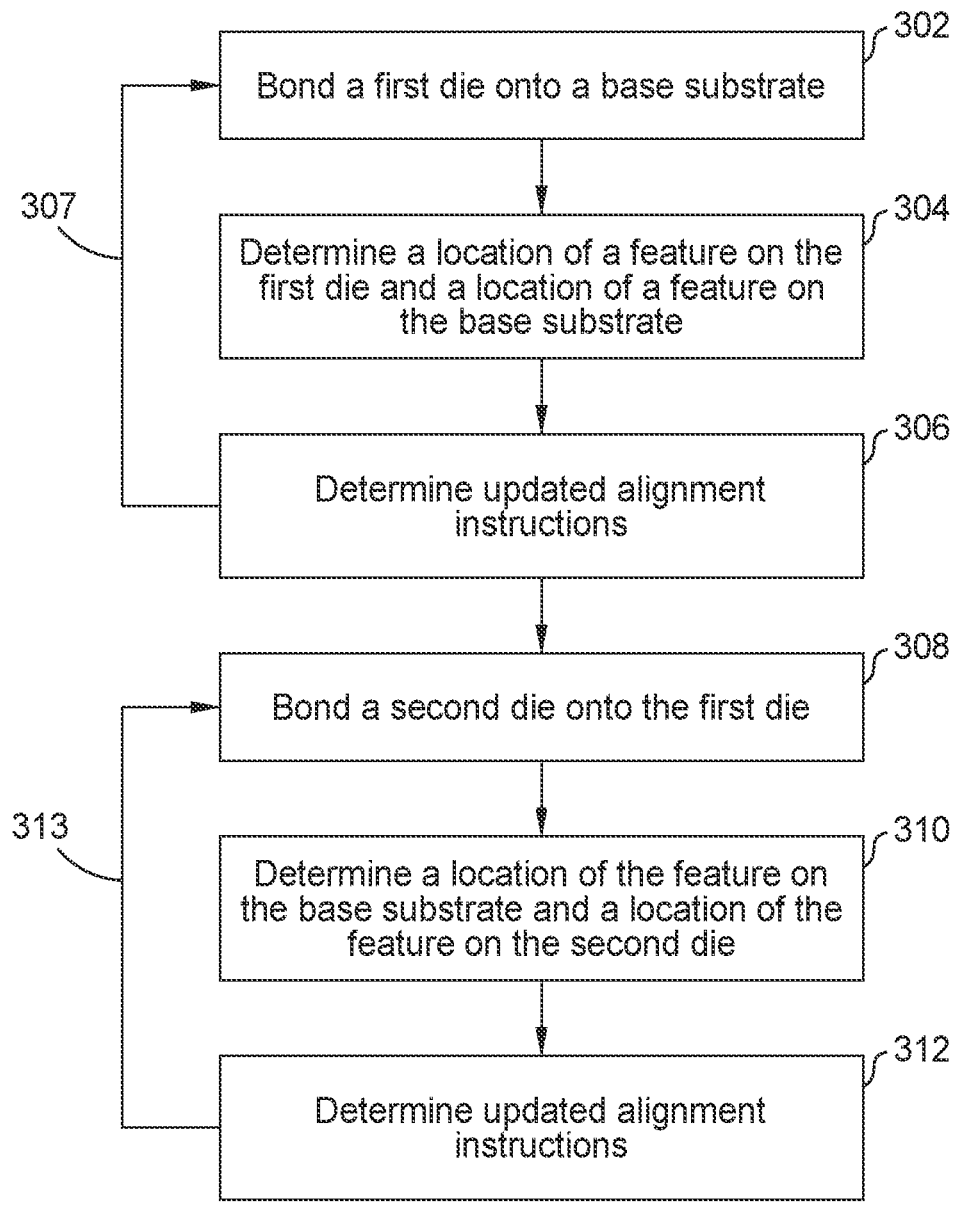
FIG. 3 is a diagram illustrating a method of forming a stacked semiconductor assembly, according to one or more embodiments.

FIGS. 8A-8E are schematic, cross-sectional views of a portion of a stacked semiconductor assembly 800 during a method for forming a stacked semiconductor assembly. FIG. 3 is a diagram illustrating a method 300 according to one or more embodiments, for forming a stacked semiconductor assembly. The method 300 may be performed using the optical inspection system 100 described above or any other optical inspection system.

At activity 302, a first die 814 is positioned and bonded onto a base substrate 804. The base substrate 804 may be positioned and secured on a stage 104 (FIGS. 1A-3) using the robot end effector system 106 (FIG. 1A).

Figure 8A:
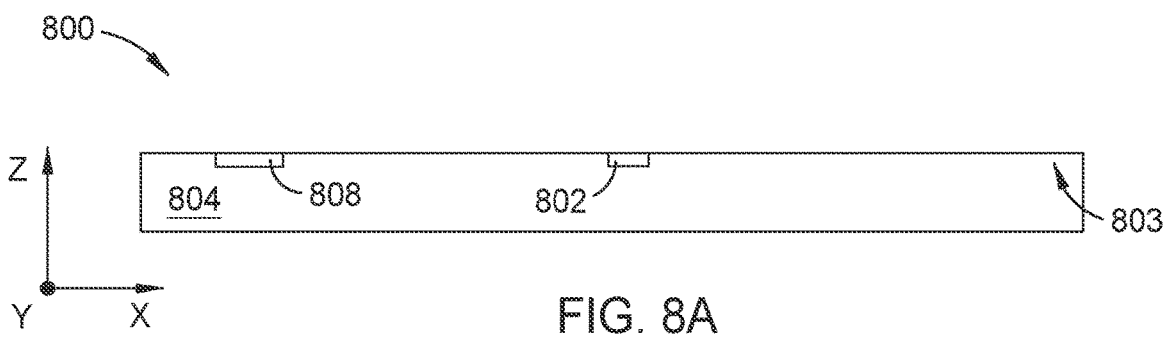
FIGS. 8A-8E are schematic, cross-sectional views of a portion of a stacked semiconductor assembly during a method of forming a stacked semiconductor assembly, according to one or more embodiments.

As shown in FIG. 8A, a feature 802 and a feature 808 may be formed on a base substrate 804. In some embodiments, the base substrate 804 may include an interposer, bridging substrate, hybrid bonding substrate, or other similar substrate. The base substrate 804 may comprise any suitable material for forming a stacked semiconductor assembly including, but not limited to, silicon (Si), silicon dioxide (SiO$_2$), doped SiO$_2$, fused silica, quartz, silicon carbide (SiC), glass, or the like. As noted above, the features 802 and 808 have a negligible effect on the operation of the stacked semiconductor assembly 800, and are used for the purpose of aligning subsequent dies that are to be stacked over the base substrate 804. The features 802 and 808 may be formed on a base surface 803 of the base substrate 804. As described above, the base surface 803 may be a front side or a back side of the base substrate 804. The features 802 and 808 may any suitable cross-sectional shape that may be used for aligning layers of a stacked semiconductor assembly on the base substrate 804. For example, the features 802 and 808 may have a square, rectangular, circular, plus sign shaped cross-section, or the like. As will be discussed in more detail below, feature 808 may be positioned on the base substrate 804 so that it is horizontally offset by a horizontal distance from features formed on subsequent dies. As will be described in more detail below, the feature 808 may be positioned and used to align layers of an identical stacked semiconductor assembly based on the horizontal distance between feature 808 and features formed on the subsequent dies.

Figure 8B:
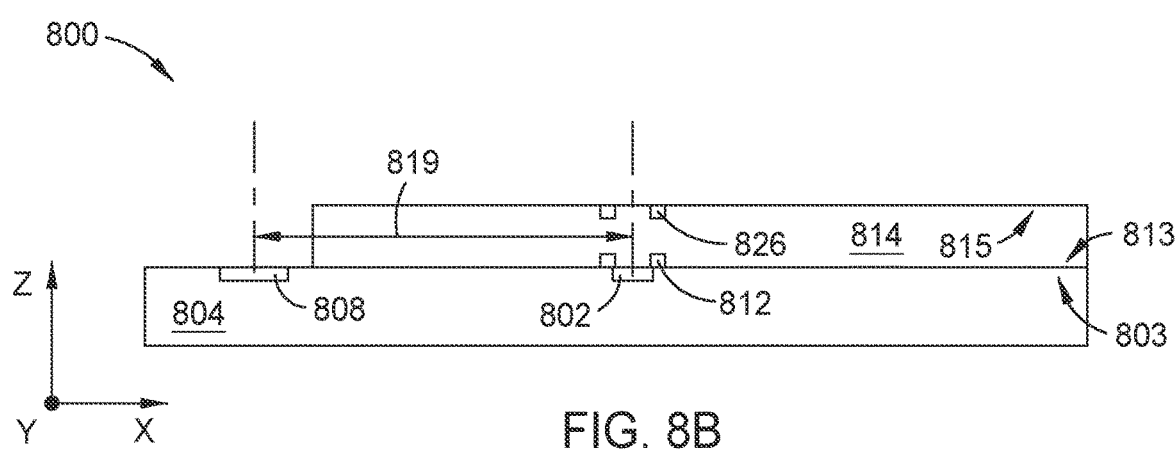
Figure 8C:
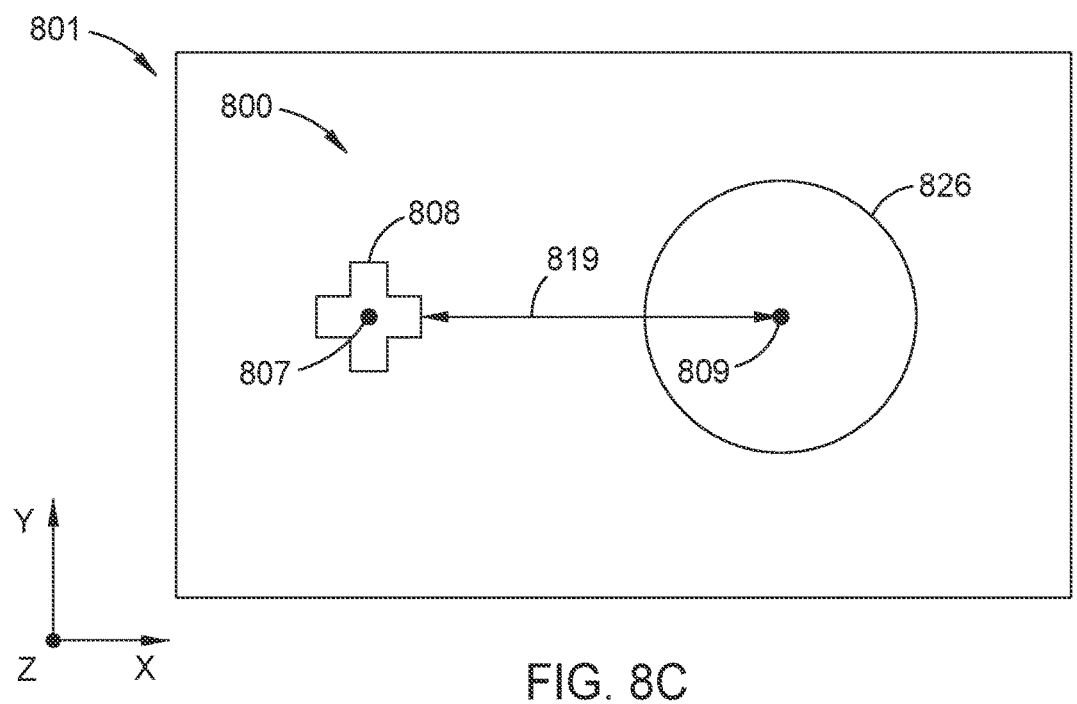

As shown in FIG. 8B, a first die 814 may be positioned and bonded onto to the base substrate 804. The first die 814 includes at least one of a feature 812 formed on a first surface 813 of the first die 814 and a feature 826 formed on a second surface 815 of the first die. In some embodiments, the first die 814 includes at least the feature that is formed on a surface of the first die 814 that is exposed when the first die 814 is disposed on the base substrate 804. In one example, the feature 826 is formed on a second surface 815 of the first die 814, which is exposed when the first die 814 is positioned on the base substrate 804 during activity 1002. The second surface 815 being on the opposite side of the first die 814 than the first surface 813. In one example, the features 812 and 826 have a same cross-section and critical dimension. In another example, the features 812 and 826 have different cross-sectional shapes and/or critical dimensions. In one example, the feature 812 and the feature 826 may be horizontally aligned on the first die 814. In another example, the feature 812 and the feature 826 may be horizontally offset from one another. The first die 814 and the base substrate 804 may be positioned in a manner such that the first surface 813 and the base surface 803 face (i.e., are directly adjacent to) one another. The features 812 and 826 are positioned on the first die 814 in a manner such that when the features 812 and 826 are a distance 819 away from the feature 808, the first die 814 and the base substrate 804 are aligned. In one example, the distance 819 is measured relative to an alignment direction of various components within the semiconductor assembly, such as a direction in the x-y plane. Stated differently, the first die 814 and the base substrate 804 are aligned by stacking the first die 814 on the base substrate 804 and adjusting the first die 814 and/or the base substrate 804 until the distance 819 is equal to a pre-determined distance, that is stored in the memory of the controller 126, indicating that the base substrate 804 and the first die 814 are aligned. In one example, the distance 819 is measured from the center 807 of the feature 808 to a center 809 of feature 826 (FIG. 8C). Stated differently, the distance 819 is measured with respect to a direction that is parallel to a plane which is parallel to the base surface 803.

At activity 304, a distance between a feature on the first die 814 and a feature on the base substrate 804 are determined. For example, using an optical inspection system, such as the optical inspection system 100, the distance 819 between the feature 826 and the feature 808 may be determined. As shown in FIG. 8C, the optical inspection system 100 generates an image 801 of the portion of the stacked semiconductor assembly 800. In this embodiment, the first die 814 may not include a material that is transmissive to the wavelengths of light provided from the optical inspection system 100, since the feature 826 is positioned on an exposed second surface 815. In one example, the image 801 is formed from a top-down view of the portion of the stacked semiconductor assembly 800. In one example, the image 801 is parallel to a plane that is parallel to the base surface 803. The image 801 corresponds to a moment in time after the first die 814 is bonded onto the base substrate 804. In one example, the feature 808 has a plus-sign cross-sectional shape and the feature 826 has a circular cross-sectional shape as seen when viewing the features in a direction that is normal to an alignment direction (e.g., direction in the x-y plane). Because the feature 812 is aligned with feature 826, and both features have a same critical dimension and cross-sectional shape, feature 826 covers feature 812 in the image 801. The controller 126, based on the image 801, may then determine the location of the feature 808 and the feature 826 using the image processing algorithm. The controller 126 may determine an OVL measurement between the feature 826 and the feature 808 based on the location of the feature 808 and the feature 826. The OVL measurement between the feature 826 and the feature 808 may include the distance 819 measured between a center 807 of the feature 808 to a center 809 of the feature 826.

At activity 306, the controller 126 (FIG. 1) determines updated alignment instructions. In one example, the controller 126 saves the updated alignment instructions to the memory of controller 126 and provides the updated alignment instructions when stacking/bonding a first die to a base substrate of an identical stacked semiconductor assembly. For example, as illustrated by arrow 307, the method may repeat activities 302 and 304 and a first die is bonded to a base substrate of an identical (subsequent) stacked semiconductor assembly with the proper alignment based on the updated alignment instructions. The updated alignment instructions cause the first die and the base substrate of the identical stacked semiconductor assembly to be aligned. For example, the controller 126, using the robot end effector system 106 and/or the stage, aligns the first die and the base substrate of an identical stacked semiconductor device based on the OVL measurement between the feature 826 and the feature 808. For example, the updated alignment instructions cause the robot end effector system 106 and/or the stage shift and/or rotate the first die or the base substrate of the identical stacked semiconductor device so that the distance 819 is equal to a pre-determined distance.

At activity 308, a second die 824 is positioned and bonded onto the first die 814. The second die 824 may be positioned onto the first die 814 using the robot end effector system 106 and/or stage 104.

Figure 8D:
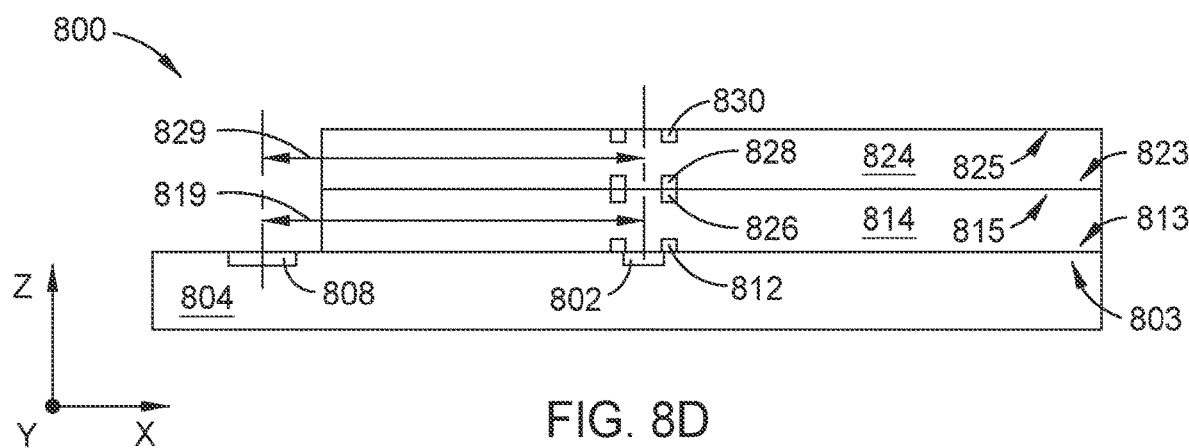

As shown in FIG. 8D, a second die 824 may be positioned and bonded onto the first die 814. The second die 824 includes a feature 828 formed on a first surface 823 of the second die 824 and a feature 830 formed on a second surface 825 of the second die 824. The second surface 825 being on the opposite side of the second die 824 than the first surface 823. In one example, the features 828 and 830 have a same cross-sectional shape as the features 812 and 826. In another example, each of the features have the same or different cross-sectional shapes and/or critical dimensions. The second die 824 and the first die 814 may be positioned in a manner such that the first surface 823 of the second die 824 and the second surface 815 of the first die 814 face (i.e., are directly adjacent to) one another. The features 828 and 830 are positioned on the second die 824 in a manner such that when the features 828 and 830 are a specific horizontal distance away from the feature 808, the second die 824 is aligned to the first die 814, as will be described in more detail below.

Figure 8E:
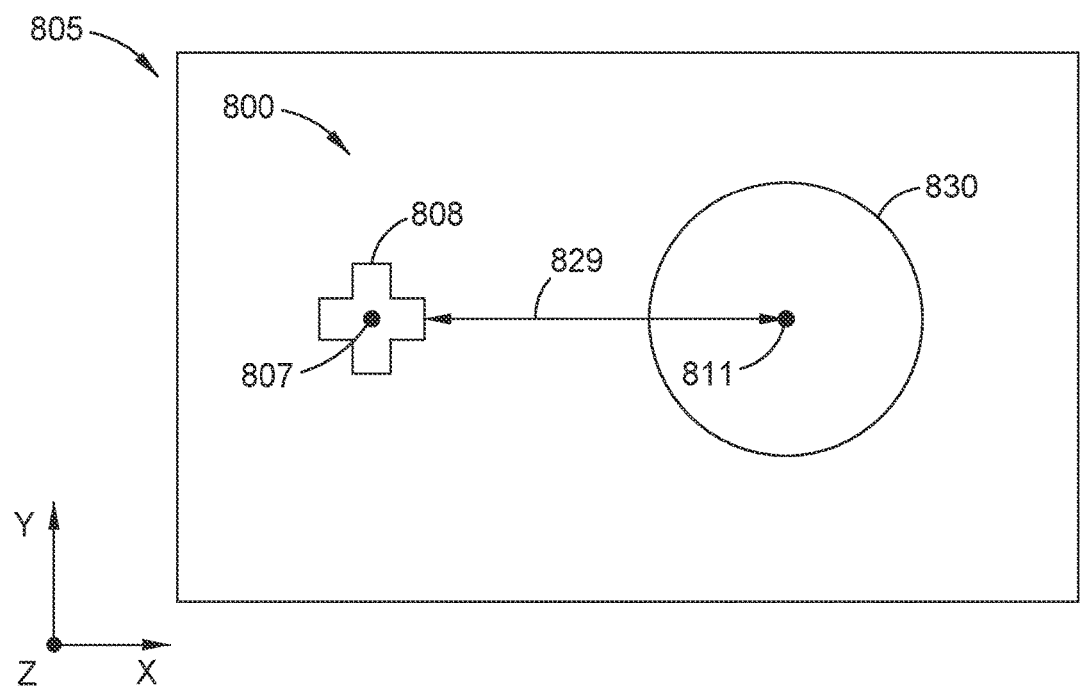

At activity 310, a distance between a feature on the second die 824 and a feature on the base substrate 804 are determined. For example, using an optical inspection system, such as the optical inspection system 100, the distance between the feature 830 and the feature 808 may be determined. As shown in FIG. 8E, the optical inspection system 100 generates an image 805 of the portion of the stacked semiconductor assembly 800. In one example, the image 805 is a top-down view of the portion of the stacked semiconductor assembly 800. In one example, the image 805 is parallel to a plane that is parallel to the base surface 803. The image 805 corresponds to a moment in time after the second die 824 is bonded onto the first die 814. In one example, the features 828 and 830 have circular cross-sectional shapes as seen when viewing the features in a direction that is normal to an alignment direction (e.g., direction in the x-y plane). Because the feature 828 is aligned with feature 830, and both features have a same critical dimension and cross-sectional shape, feature 830 covers feature 826 in the image 805. Similarly, because features 812, 826, 828, and 830 have a same critical dimension, cross-sectional shape, and are aligned, so only features 808 and 830 are visible in image 805. The controller 126, based on the image 805, may then determine the location of the feature 808 and the feature 830. The controller 126 may determine an OVL measurement between the feature 830 and the feature 808 based on the location of the feature 830 and the feature 826 using the image processing algorithm. The OVL measurement between the feature 830 and the feature 808 may include a distance 829 measured between a center 807 of the feature 808 and a center 811 of the feature 830. In one example, the distance 829 is measured relative to an alignment direction of various components within the semiconductor assembly, such as a direction in the x-y plane.

At activity 312, the controller 126 (FIG. 1) determines updated alignment instructions. The updated alignment instructions are based on the OVL measurement between the feature 830 and the feature 808. In one example, the controller 126 saves the updated alignment instructions to the memory of controller 126 and provides the updated alignment instructions when stacking/bonding a second die to a first die of an identical stacked semiconductor assembly. For example, as illustrated by arrow 313, the method may repeat activities 308 and 310 and a second die is bonded to a first die of an identical (subsequent) stacked semiconductor assembly with the proper alignment based on the updated alignment instructions. Stated differently, the updated alignment instructions cause the OVL measurement between the feature 808 and the feature 830 to be equal to a pre-determined distance that is also stored in the memory of the controller 126. For example, the updated alignment instructions cause the second die and/or the first die of the identical stacked semiconductor assembly to be shifted and/or rotated along the x, y, and/or z axis until the distance 829 is equal to a pre-determined distance. This process may be repeated for each subsequent layer of the stacked semiconductor assembly 800.

In some embodiments, a plurality of features are formed in and distributed across a surface of the base substrate and die to allow the correct position and alignment of each successively placed die onto the base substrate. In one example, the base surface 803 and first surface 813 each include at least two of features 808 and features 826, respectively that are each positioned relative to each other so that when positioned correctly, the two sets of features set the x-y position and angular alignment of the first die 814 to the base substrate 804. Thus, in some embodiments, activity 312 can include the additional activity of comparing the position of more than one pair of mating features to properly position and align a die to the base substrate or a first die to a second die of the identical semiconductor assembly.

Alternative Layer Alignment Method

FIGS. 9A-9G are schematic, cross-sectional views of a portion of a stacked semiconductor assembly 900 during a method for forming the stacked semiconductor assembly 900. FIGS. 9A-9G are described with reference to FIG. 4.

At activity 402, a first die 914 is positioned and bonded onto a base substrate 904. The base substrate 904 may be positioned and secured on a stage 104 (FIGS. 1A-3) using the robot end effector system 106 (FIG. 1A).

As shown in FIG. 9A, a feature 902 having a critical dimension 910 and a feature 942 having a critical dimension 944 may be formed on the base substrate 904. The critical dimension 910 and the critical dimension 944 may be measured relative to an alignment direction of the various components within the semiconductor assembly, such as a direction within the x-y plane (FIG. 9B). In some embodiments, the base substrate 904 may include an interposer, bridging substrate, hybrid bonding substrate, or other similar substrate. The base substrate 904 may comprise any suitable material for forming a stacked semiconductor assembly including, but not limited to, silicon (Si), silicon dioxide ($SiO_2$), doped $SiO_2$, fused silica, quartz, silicon carbide (SiC), glass, or the like. As noted above, the features 902 and 942 are configured to have a negligible effect on the operation of the stacked semiconductor assembly, and are used for the purpose of aligning subsequent dies that are to be stacked over the base substrate 904. The feature 902 may be formed on a first surface 903 of the base substrate 904. The first surface 903 may be a front side or a back side of the base substrate 904. The feature 942 may be formed on a second surface 905 of the base substrate 904. The second surface 905 being on the opposite side of the base substrate 904 than the first surface 903. The features 902 and 942 may be formed in the same manner described with respect to features 502, 602, 702 and 802. The features 902 and 942 may have any suitable cross-sectional shape that may be used for aligning layers of a stacked semiconductor assembly on the base substrate 904. For example, the features 902 and 942 may have a square, rectangular, circular, plus sign shaped cross-section, or the like.

The critical dimension 910 may be larger than the critical dimension 944. In one example, feature 942 may be offset from feature 902 by a distance 911. The distance 911 may be the distance measured along the horizontal axis (i.e., the x-axis) between centerline 907 and a centerline 909. The centerline 907 is orientated in the vertical direction and intersects with the center of feature 902. The centerline 909 is orientated in the vertical direction and intersects with the center of feature 942.

As shown in FIG. 9B, a first die 914 may be bonded to the base substrate 904. The first die 914 includes a feature 912 formed on a first surface 913 of the first die 914 and a feature 926 formed on a second surface 915 of the first die. The second surface 915 being on the opposite side of the first die 914 than the first surface 913. The feature 912 may have a critical dimension 920. The feature 926 may have a critical dimension 921 that is measured relative to an alignment direction (e.g., x-y plane) of the first die 914 to the base substrate 904. The critical dimension 920 may be equal to the critical dimension 944. The critical dimension 921 may be equal to the critical dimension 910.

The first die 914 and the base substrate 904 may be bonded in a manner such that the first surface 913 and the first surface 903 face (i.e., are directly adjacent to) one another. In one example, the first die 914 and the base substrate 904 are aligned based on aligning features 902 and 912. Because the critical dimension 920 is smaller than the critical dimension 910 and the critical dimension 921 is larger than critical dimension 944, the features 912 and 926 may be positioned on the first die 914 in a manner such that the first die 914 and the base substrate 904 are aligned when feature 912 is centered within feature 902 and feature 942 is centered within feature 926. Therefore, feature 912 and feature 926 are also offset by a distance 917. The distance 917 may be a distance measured along the horizontal axis (i.e., the x-axis) between centerline 908 and a centerline 916. The centerline 908 is orientated in the vertical direction and intersects with the center of feature 912. The centerline 916 is orientated in the vertical direction and intersects with the center of feature 926. When the first die 914 and the base substrate 904 are aligned, centerlines 907 and 908 intersect and centerlines 909 and 916 intersect. In some configurations, when aligning the first die 914 and the base substrate 904, feature 912 and 926 are out of focus in an image 901 captured by an optical inspection system when aligning the first die 914 and the base substrate 904 (FIG. 9C). Therefore, in some examples, the first die 914 and the base substrate 904 are aligned when feature 912 is centered within feature 902.

At activity 404, a relative displacement between a feature on the first die 914 and a feature on the base substrate 904 are determined. For example, using an optical inspection system, such as the optical inspection system 100, the relative displacement between the feature 902 and the feature 912 may be determined. As shown in FIG. 9C, the optical inspection system 100 generates an image 901 of the portion of the stacked semiconductor assembly 900. In one example, the top-down view may be an image 901 of the device the portion of the stacked semiconductor assembly 900 captured by the optical inspection system 100. In one example, the image 901 is parallel to a plane that is parallel to the first surface 903. The image 901 corresponds to a moment in time after the first die 914 is bonded onto the base substrate 904. In one example, the image 901 includes at least a portion of features 902. As described above, in some configurations the features 926 and 942 are not visible (i.e., are out of focus) in the image 901 and are included for reference. The controller 126, based on the image 901, may determine the relative displacement between the feature 902 and the feature 912. The controller 126 may determine an OVL measurement between the feature 912 and the feature 902 based on the relative displacement between the feature 912 and the feature 902. The OVL measurement between the feature 912 and the feature 902 may include a distance 948 measured from at least one point of interest (POI), such as POI 946, located on the outer perimeter surface 929 of the feature 902 to the centerline 908. In one example, the features 902, 912, 926, and 942 have circular-cross sectional shapes. The POI 946 can be determined based on an analysis of the images that is performed by one or more software applications running on the controller 126.

At activity 406, the controller 126 (FIG. 1) determines updated alignment instructions. In one example, the controller 126 saves the updated alignment instructions to the memory of controller 126 and provides the updated alignment instructions when stacking/bonding a first die to a base substrate of an identical stacked semiconductor assembly. In one example, the updated alignment instructions are based on the relative displacement between the features 902 and 912.

The updated alignment instructions may be determined such that feature 912 is centered within feature 902. Using the updated alignment instructions and the robot end effector system 106 and/or the stage 104, the controller 126 aligns a first die and a base substrate of an identical stacked semiconductor assembly. For example, as illustrated by arrow 407, the method may repeat activities 402 and 404 and a first die is bonded to the base substrate of an identical (subsequent) stacked semiconductor assembly with the proper alignment based on the updated alignment instructions. Stated differently, the updated alignment instructions cause the robot end effector system 106 and/or the stage 104 to shift and or rotate the first die and/or the base substrate of the identical stacked semiconductor assembly along the x, y, and or z-axis so that the distance 948 is equal to a first pre-determined distance that is stored in the memory of the controller 126. The first pre-determined distance may be determined based on the critical dimension 910.

Figure 9E:
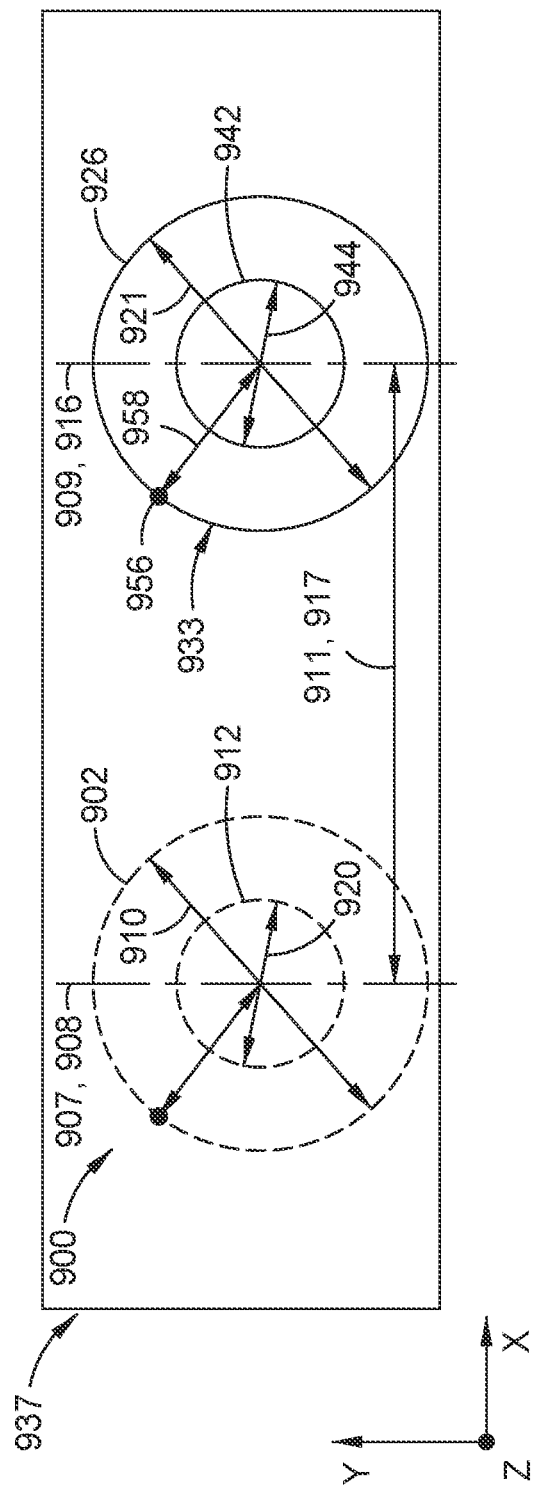

At activity 408, a second die 924 is positioned and bonded onto the first die 914. The second die 924 may be positioned onto the first die 914 using the robot end effector system 106. As shown in FIG. 9D, the second die 924 may be stacked and bonded onto to the first die 914. The second die 924 includes the feature 902 formed on a second surface 925 and the feature 942 formed on a first surface 923. The second surface 925 being on the opposite side of the second die 924 than the first surface 923. The second die 924 and the first die 914 may be stacked in a manner such that the first surface 923 and the second surface 915 face (i.e., are directly adjacent to) one another. The features 902 and 942 are formed and positioned on the second die 924 in the same manner described with respect to the base substrate 904. In one example, the second die 924 and the first die 914 are aligned based on aligning the features 926 and 942. In some configurations, when aligning the second die 924 and the first die 914, the features 902 and 912 are out of focus in an image 937 captured by an optical inspection system when aligning the second die 924 and the first die 914 (FIG. 9E). Therefore, in some examples, the second die 924 and the first die 914 are aligned when feature 942 is centered within feature 926.

At activity 410, a relative displacement between a feature on the second die 924 and a feature on the first die 914 are determined. For example, using an optical inspection system, such as the optical inspection system 100, the relative displacement between the feature 926 and the feature 942 may be determined. As shown in FIG. 9E, the optical inspection system 100 generates an image 937 of the portion of the stacked semiconductor assembly 900. In one example, the top-down view may be an image 937 of the device the portion of the stacked semiconductor assembly 900 captured by the optical inspection system 100. In one example, the image 937 is parallel to a plane that is parallel to the first surface 903. The image 937 corresponds to a moment in time after the second die 924 is bonded onto the first die 914. In one example, the image 901 includes at least a portion of features 926 and 942. As described above, in some configurations the features 902 and 912 are not visible (i.e., are out of focus) in the image 937 and are included for reference. The controller 126, based on the image 937, may determine the relative displacement between the feature 926 and the feature 942. The controller 126 may determine an OVL measurement between the feature 926 and the feature 942 based on the relative displacement between the feature 926 and the feature 942. The OVL measurement between the feature 926 and the feature 942 may include a distance 958 measured from at least one point of interest (POI), such as POI 956, located on the outer perimeter surface 933 of the feature 926 to the centerline 909. In one example, the features 902, 912, 926, and 942 have circular-cross sectional shapes. The POI 956 can be determined based on an analysis of the images that is performed by one or more software applications running on the controller 126.

At activity 412, the controller 126 (FIG. 1) determines updated alignment instructions. In one example, the controller 126 saves the updated alignment instructions to the memory of controller 126 and provides the updated alignment instructions when stacking/bonding a second die to a first die of an identical stacked semiconductor assembly. In one example, the updated alignment instructions are based on the relative displacement between the features 926 and 942. The updated alignment instructions may be determined such that feature 942 is centered within feature 926. Using the updated alignment instructions and the robot end effector system 106 and/or the stage 104, the controller 126 aligns a second die and a first die of an identical stacked semiconductor assembly. For example, as illustrated by arrow 413, the method may repeat activities 408 and 410 and a second die is bonded to a first die of an identical (subsequent) stacked semiconductor assembly with the proper alignment based on the updated alignment instructions.

This process may be repeated for each layer of the stacked semiconductor assembly 900. Stated differently, each layer of the stacked semiconductor assembly may be assigned an index equal to integer N starting at N equal to zero. For example, the base substrate 904 may be assigned a value of 0, the first die 914 may be assigned a value of 1, and the second die 924 may be assigned a value of 2, and so on. Each die assigned an even value may include features 902 and 942. Each die assigned an odd value may include features 912 and 926. Adjacent even layers and odd layers may be aligned to each other in the manner described above. For example, base substrate 904 is aligned to first die 914 by centering feature 912 within feature 902. Then the second die 924 is aligned to the first die 914 by centering feature 942 within feature 926. Furthermore, a third die (not shown) would include features 902 and 942 and would be aligned to the second die 924 by centering feature 912 within feature 902.

Figure 9F:
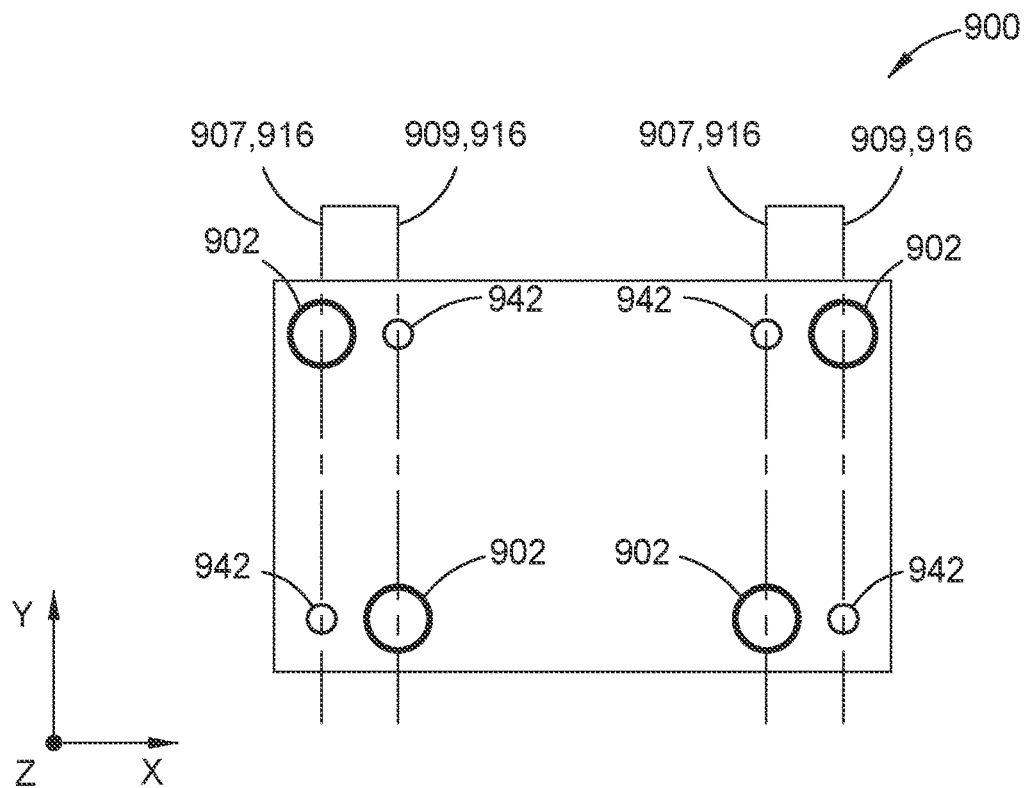

FIG. 9F illustrates a top-view of a portion an even indexed layer of the stacked semiconductor assembly 900. As described above, each even indexed layer of the stacked semiconductor assembly includes feature 902 and feature 942.

Figure 9G:
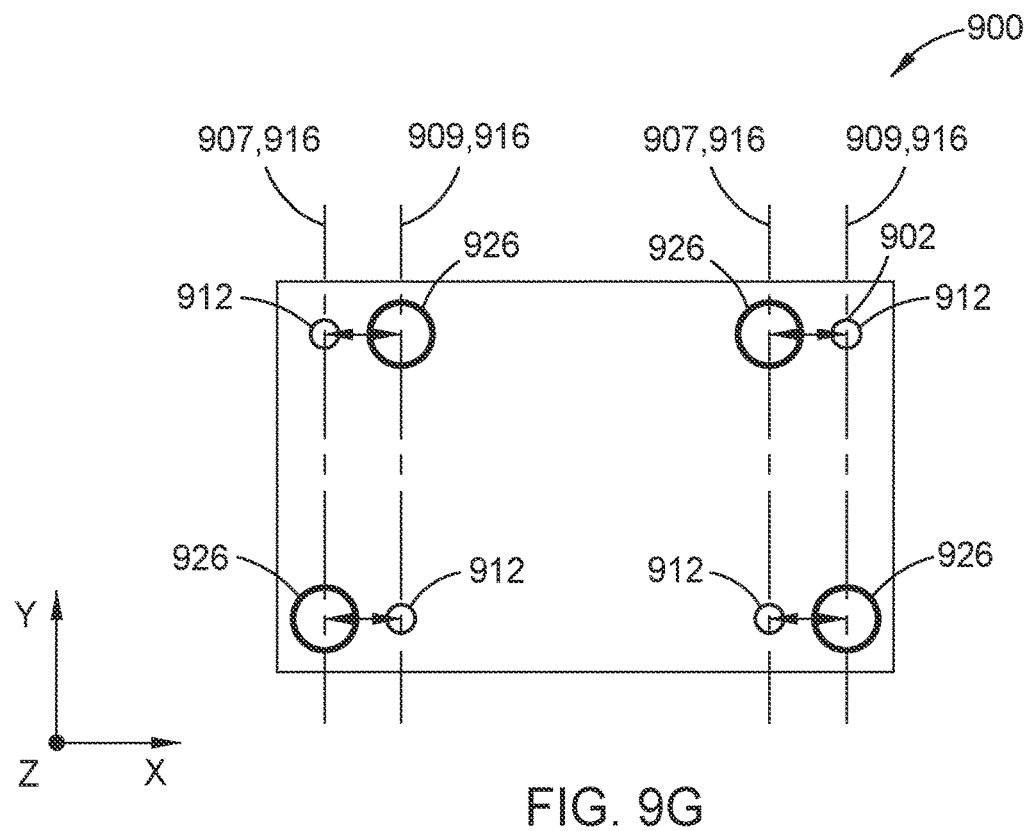

FIG. 9G illustrates a top-view of a portion of an odd indexed layer of the stacked semiconductor assembly 900. As described above, each odd indexed layer of the stacked semiconductor assembly includes feature 912 and feature 926.

Embodiments by the present principles may be implemented in hardware, firmware, software, or any combination thereof. Embodiments may also be implemented as instructions stored using one or more computer-readable media, which may be read and executed by one or more processors. A computer-readable medium may include any mechanism for storing or transmitting information in a form readable by a machine (e.g., a computing platform or a "virtual machine" running on one or more computing platforms). For example, a computer-readable medium may include any suitable form of volatile or non-volatile memory. In some embodiments, the computer-readable media may include a non-transitory computer-readable storage medium.

While the foregoing is directed to embodiments of the present principles, other and further embodiments of the principles may be devised without departing from the basic scope thereof.

What is claimed is:

1. A method for forming a device, the method comprising:
generating an image of a second die that is bonded on a first die that is bonded on a base substrate, the first die having a first feature formed on a first surface of the first die and the second die having a second feature formed on a second surface of the second die;
determining a relative displacement between portions of the first feature and the second feature based on the generated image; and
determining updated alignment instructions based on the determined relative displacement, wherein:
the first feature has a first critical dimension; and
the second feature has a second critical dimension, wherein the first critical dimension and the second critical dimension are equal, wherein
determining updated alignment instructions comprises determining updated alignment instructions that cause the second feature to cover a third feature formed on the base substrate of a subsequent device.

2. The method of claim 1, wherein the first surface of the first die is a device side of the first die, and the first feature is formed in a non-electrical section of the first die.

3. The method of claim 1, wherein the first surface of the first die is a back side of the first die.

4. The method of claim 1, further comprising:
delivering a light at a first wavelength towards the first die and the second die; and
determining a relative displacement between the first feature and the second feature based on light reflected off the first die and the second die and captured by an image sensor, and wherein determining the updated alignment instructions is based on the determined relative displacement between the second feature and the first feature.

5. A method for forming a device, the method comprising:
generating an image of a second die that is bonded on a first die that is bonded on a base substrate, the first die having a first feature formed on a first surface of the first die and the second die having a second feature formed on a second surface of the second die;
determining a relative displacement between portions of the first feature and the second feature based on the generated image; and
determining updated alignment instructions based on the determined relative displacement, wherein:
the first feature has a first critical dimension; and
the second feature has a second critical dimension, wherein the first critical dimension is larger than the second critical dimension, wherein determining updated alignment instructions comprises determining updated alignment instructions that cause the second feature to be centered within the first feature of a subsequent device, wherein the first die includes a third feature disposed on a second surface of the first die that is offset from the first feature in a direction that is parallel to a plane that is parallel to a base surface of the base substrate, the second surface being opposite the first surface of the first die, and wherein the third feature is aligned with a base feature formed on the base substrate.

6. A method of forming a device, the method comprising:
generating an image of a second die that is bonded on a first die that is bonded on a base substrate, the first die having a first feature formed on a first surface of the first die and the second die having a second feature formed on a second surface of the second die;
determining a relative displacement between portions of the first feature and the second feature based on the generated image; and
determining updated alignment instructions based on the determined relative displacement, wherein:
the first die includes a third feature formed on a second surface of the first die, the third feature being offset from the first feature in a first direction by a first distance, wherein the first direction is a direction parallel to a base surface of the base substrate and the first distance is measured in the first direction;
the second die includes a fourth feature formed on a second surface of the second die, the fourth feature being offset from the second feature in the first direction by the first distance;
the second die is positioned onto the first die such that the first surface of the first die and the first surface of the second die face one another;
the first feature has a first critical dimension;
the second feature has a second critical dimension that is smaller than the first critical dimension;
the third feature has a critical dimension equal to the second critical dimension; and
the fourth feature has a critical dimension equal to the first critical dimension, wherein determining updated alignment instructions comprises determining updated alignment instructions that cause the second feature to be centered within the first feature.

7. A method for forming a device, the method comprising:
generating a first image of the first die bonded to a base substrate, the first die having a first feature formed on a first surface of the first die, the base substrate having a base feature formed on a base surface of the base substrate, and the first image is parallel to a first plane that is parallel to the base surface of the base substrate and includes at least a portion of the first feature of the first die and at least a portion of the base feature of the base substrate;
determining a first distance in the first direction between the portions of the first feature and the base feature, the first direction being a direction parallel to the first plane;
generating a second image of a second die that is bonded on the first die that is bonded onto the base substrate, the second die having a second feature disposed on a first surface of the second die, and the second image is parallel to the first plane and includes at least a portion of the second feature of the second die and at least a portion of the base feature of the base substrate;
determining a second distance in the first direction between the portions of the second feature and the base feature; and
determining updated alignment instructions based on the first distance between the first feature and the base feature, and the second distance between the second feature and the base feature.

8. The method of claim 7, wherein determining updated alignment instructions comprises determining updated alignment instructions that cause the first distance to be equal to a predetermined distance.

9. The method of claim 7, determining updated alignment instructions based on the second distance between the second feature and the base feature comprises determining updated alignment instructions that cause the second distance to be equal to a predetermined distance.

10. An optical inspection system comprising:
a controller;
a memory for storing a program to be executed in the controller, the program comprising instructions when executed cause the controller to:
generate an image of a second die that is bonded on a first die that is bonded on a base substrate, the first die having a first feature formed on a first surface of the first die and the second die having a second feature formed on a second surface of the second die;
determine a relative displacement between portions of the first feature and the second feature based on the generated image; and
determine updated alignment instructions based on the determined relative displacement, wherein:
the first feature has a first critical dimension; and
the second feature has a second critical dimension, wherein the first critical dimension is greater than the second critical dimension, wherein the instructions for determining updated alignment instructions further comprise instructions to determine updated alignment instructions that cause the second feature to be centered within the first feature of a subsequent device, wherein the first die includes a third feature disposed on a second surface of the first die that is offset from the first feature in a direction that is parallel to a plane that is parallel to a base surface of the base substrate, the second surface being opposite the first surface of the first die, and wherein the third feature is aligned with a base feature formed on the base substrate.

11. The optical inspection system of claim 10, wherein the optical inspection system comprises an infrared light source that is disposed above a stage.

12. An optical inspection system comprising
a controller;
a memory for storing a program to be executed in the controller, the program comprising instructions when executed cause the controller to:
generate an image of a second die that is bonded on a first die that is bonded on a base substrate, the first die having a first feature formed on a first surface of the first die and the second die having a second feature formed on a second surface of the second die;
determine a relative displacement between portions of the first feature and the second feature based on the generated image; and
determine updated alignment instructions based on the determined relative displacement, wherein:
the first feature has a first critical dimension; and
the second feature has a second critical dimension, wherein the first critical dimension and the second critical dimension are equal, wherein the instructions determining updated alignment instructions comprise instructions to determine updated alignment instructions that cause the second feature to cover a third feature formed on the base substrate.

13. An optical inspection system comprising,
a controller;
a memory for storing a program to be executed in the controller, the program comprising instructions when executed cause the controller to:
generate an image of a second die that is bonded on a first die that is bonded on a base substrate, the first die having a first feature formed on a first surface of the first die and the second die having a second feature formed on a second surface of the second die;
determine a relative displacement between portions of the first feature and the second feature based on the generated image; and
determine updated alignment instructions based on the determined relative displacement, wherein:
the first die includes a third feature formed on a second surface of the first die, the third feature being offset from the first feature in a first direction by a first distance, wherein the first direction is a direction parallel to a base surface of the base substrate and the first distance is measured in the first direction;
the second die includes a fourth feature formed on a second surface of the second die, the fourth feature being offset from the second feature in the first direction by the first distance;
the second die is positioned onto the first die such that the first surface of the first die and the first surface of the second die face one another;
the first feature has a first critical dimension;
the second feature has a second critical dimension that is less than the first critical dimension;
the third feature has a critical dimension equal to the second critical dimension; and
the fourth feature has a critical dimension equal to the first critical dimension, wherein the instructions for determining updated alignment instructions further comprise instructions to determine updated alignment instructions that cause the second feature to be centered within the first feature.

* * * * *